(12) United States Patent
Maekawa et al.

(10) Patent No.: US 11,004,938 B2
(45) Date of Patent: May 11, 2021

(54) SEMICONDUCTOR SUBSTRATE STRUCTURE AND POWER SEMICONDUCTOR DEVICE

(71) Applicant: ROHM CO., LTD., Kyoto (JP)

(72) Inventors: Takuji Maekawa, Kyoto (JP); Mitsuru Morimoto, Kyoto (JP); Makoto Takamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/425,405

(22) Filed: May 29, 2019

(65) Prior Publication Data

US 2019/0371894 A1    Dec. 5, 2019

(30) Foreign Application Priority Data

May 31, 2018    (JP) .............................. JP2018-104672
May 31, 2018    (JP) .............................. JP2018-104673

(51) Int. Cl.
| | | |
|---|---|---|
| *H01L 29/872* | (2006.01) | |
| *H01L 29/16* | (2006.01) | |
| *H01L 29/78* | (2006.01) | |
| *H01L 21/18* | (2006.01) | |
| *H01L 29/66* | (2006.01) | |

(52) U.S. Cl.
CPC ........ *H01L 29/1608* (2013.01); *H01L 21/185* (2013.01); *H01L 29/6606* (2013.01); *H01L 29/66068* (2013.01); *H01L 29/7813* (2013.01); *H01L 29/872* (2013.01)

(58) Field of Classification Search
CPC . H01L 21/185; H01L 21/2007; H01L 29/045; H01L 29/0619; H01L 29/1608; H01L 29/2003; H01L 29/6606; H01L 29/66068; H01L 29/7397; H01L 29/74; H01L 29/7802; H01L 29/7813; H01L 29/872
USPC .......................................................... 257/77
See application file for complete search history.

(56) References Cited

U.S. PATENT DOCUMENTS

| | | | | | |
|---|---|---|---|---|---|
| 5,371,037 | A | * | 12/1994 | Yonehara | .......... H01L 21/76243 117/10 |
| 5,763,344 | A | * | 6/1998 | Komatsu | ............... C04B 35/581 264/681 |
| 6,133,112 | A | * | 10/2000 | Iwane | .................. H01L 21/2007 257/53 |
| 6,242,374 | B1 | * | 6/2001 | Komatsu | ............... C04B 35/584 264/683 |

(Continued)

FOREIGN PATENT DOCUMENTS

| | | |
|---|---|---|
| DE | 102017127169 A1 | 5/2019 |
| JP | 5628530 B2 | 8/2011 |
| JP | 6206786 B | 10/2017 |

OTHER PUBLICATIONS

German Patent and Trademark Office; Office Action for related application DE 10 2019 114 328.4; dated Jan. 25, 2021; 10pages.

(Continued)

*Primary Examiner* — Long K Tran
(74) *Attorney, Agent, or Firm* — Gregory M. Howison

(57) ABSTRACT

A semiconductor substrate structure includes: a substrate; and an epitaxial growth layer bonded to the substrate, wherein the substrate and the epitaxial growth layer are bonded by a room-temperature bonding or a diffusion bonding.

11 Claims, 31 Drawing Sheets

(56) References Cited

U.S. PATENT DOCUMENTS

| | | | |
|---|---|---|---|
| 2015/0206853 A1* | 7/2015 | Matsushita | B32B 37/18 |
| | | | 156/151 |
| 2015/0255354 A1* | 9/2015 | Kitada | H01L 21/263 |
| | | | 257/507 |
| 2019/0157395 A1 | 5/2019 | Schulze et al. | |
| 2020/0027814 A1* | 1/2020 | Ichiryu | H01L 23/29 |

OTHER PUBLICATIONS

S. Essig and F. Dimroth; Fast Atom Beam Activated Wafer Bonds between n-Si and n-GaAs with Low Resistance; pp. Q178-Q181; published Jul. 27, 2013; ECS Journal of Solid State Science and Technology, v2n9 (2013) (available at https://iopscience.iop.org/article/10.1149/2.031309jss).†

S. Essig, O. Moutanabbir, A. Wekkeli, H. Nahme, E. Oliva, A. W. Bett, and F. Dimroth; Fast atom beam-activated n-Si/n-GaAs wafer bonding with high interfacial transparency and electrical conductivity; pp. 203512-1 through 203512-6; published May 28, 2013; Journal of Applied Physics 113, 203512 (2013) (available at AIP Publishing, https://aip.scitation.org/doi/10.1063/1.4807905).†

F. Mu, K. Iguchi, H. Nakazawa, Y. Takahashi, M. Fujino, and T. Suga; Direct Wafer Bonding of SiC-SiC by SAB for Monolithic Integration of SiC MEMS and Electronics; pp. P451-P456; published Jun. 30, 2016; ECS Journal of Solid State Science and Technology, v5n9 (2016) (available at https://iopscience.iop.org/article/10.1149/2.0011609jss).†

\* cited by examiner
† cited by third party

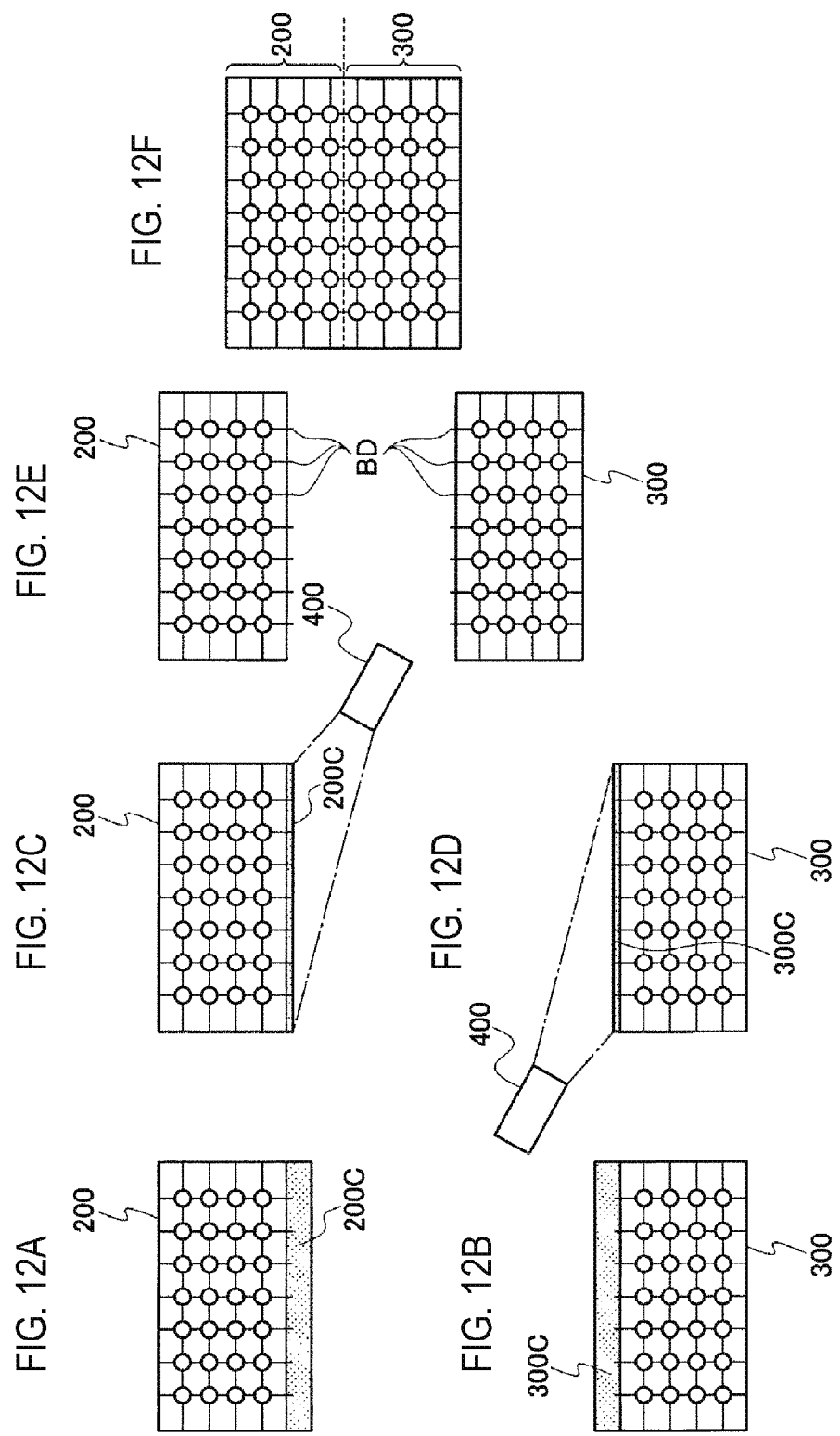

SEMICONDUCTOR SUBSTRATE STRUCTURE AND POWER SEMICONDUCTOR DEVICE

CROSS-REFERENCE TO RELATED APPLICATIONS

This application is based upon and claims the benefit of priority from Japanese Patent Application No. 2018-104672, filed on May 31, 2018, and Japanese Patent Application No. 2018-104673, filed on May 31, 2018, the entire contents of which are incorporated herein by reference.

TECHNICAL FIELD

The present disclosure relates to a semiconductor substrate structure and a power semiconductor device.

BACKGROUND

Recently, silicon carbide (SiC) semiconductors that can realize high withstand voltage, large current, low on resistance, high efficiency, low power consumption, high-speed switching, or the like are attracting attention because they have a wider band gap energy and higher electric field withstand voltage performance than Si semiconductors and GaAs semiconductors. Since SiC can reduce the generation of carbon dioxide gas ($CO_2$) due to its low power consumption performance, it is also attracting attention in terms of environmental protection.

In recent years, the SiC devices have been applied to, for example, various application fields such as air conditioners, solar power generation systems, automobile systems, train/vehicle systems, and the like.

Methods of forming an SiC wafer include, for example, a method of forming an SiC epitaxial growth layer on an SiC single crystalline substrate by a sublimation method using a chemical vapor deposition (CVD) method, a method of bonding an SiC single crystalline substrate by a sublimation method onto a CVD polycrystalline substrate of SiC and forming an SiC epitaxial growth layer on the SiC single crystalline substrate by the CVD method, and the like.

Heretofore, it was necessary to sequentially fabricate a semiconductor device using SiC because the epitaxial growth layer was formed on the substrate.

Since the SiC epitaxial growth layer takes over the crystal structure of the underlying SiC single crystalline substrate, the SiC single crystalline substrate of good crystal quality is desirable. As a result, there are characteristics required for substrates to be epitaxially grown, such as close lattice constants and close thermal expansion coefficients, and high quality substrates such as the single crystalline substrate have been required.

SUMMARY

Some embodiments of the present disclosure provide a semiconductor substrate structure capable of eliminating restrictions on materials, achieving cost reduction and obtaining desired physical properties, and a power semiconductor device including the semiconductor substrate structure.

Meanwhile, when a single crystalline wafer and a porous support substrate are bonded, it is difficult to obtain a flat surface for the support substrate due to the influence of recesses and internal cavities in the surface of the support substrate. Thus, a sufficient bonding strength cannot be obtained. Therefore, a method of cooling and fixing a bonding agent or a molten material at the interface between the single crystalline wafer and the porous support substrate and polishing the bonding agent or the molten material has been devised. However, bonding under a high temperature atmosphere where the bonding agent is decomposed is difficult. It is also difficult to adopt a material, which does not readily form a stable liquid phase, as the molten material.

Further, some embodiments of the present disclosure provide a semiconductor substrate structure having a stable bonding strength and high reliability even under a high temperature environment, and a power semiconductor device including the semiconductor substrate structure.

According to one embodiment of the present disclosure, there is provided a semiconductor substrate structure including: a substrate; and a silicon carbide epitaxial growth layer bonded to the substrate, wherein the substrate and the silicon carbide epitaxial growth layer are bonded by a room-temperature bonding.

According to another embodiment of the present disclosure, there is provided a semiconductor substrate structure including: a substrate; and a silicon carbide epitaxial growth layer bonded to the substrate, wherein the substrate and the silicon carbide epitaxial growth layer are bonded by a diffusion bonding.

According to yet another embodiment of the present disclosure, there is provided a power semiconductor device including the semiconductor substrate structure.

According to yet another embodiment of the present disclosure, there is provided a semiconductor substrate structure including: a substrate; a surface roughness improvement layer arranged on the substrate; and a single crystalline body bonded to the substrate via the surface roughness improvement layer by a room-temperature bonding.

According to yet another embodiment of the present disclosure, there is provided a semiconductor substrate structure including: a substrate, a surface roughness improvement layer arranged on the substrate, and a single crystalline body diffusion-bonded to the substrate via the surface roughness improvement layer by diffusion bonding.

According to yet another embodiment of the present disclosure, there is provided a power semiconductor device including the semiconductor substrate structure.

BRIEF DESCRIPTION OF THE DRAWINGS

FIGS. 5A and 5B are explanatory views of a semiconductor substrate structure according to a basic technique, in which FIG. 5A is a schematic cross-sectional view of a configuration in which a polycrystalline body is arranged on a single crystalline body, and FIG. 5B is a schematic cross-sectional view of an ideal configuration in which the single crystalline body and the polycrystalline body are bonded.

FIGS. 12A to 12F are illustrations of a room-temperature bonding applicable to the method of manufacturing a semiconductor substrate structure according to one embodiment of the present disclosure to which the present technique is applied, in which FIG. 12A a schematic view of a first substrate covered with contaminants, FIG. 12B is a schematic view of a second substrate covered with contaminants, FIG. 12C is a schematic view of an etching process of a surface of the first substrate covered with contaminants, FIG. 12D is a schematic view of an etching process of a surface of the second substrate covered with contaminants, FIG. 12E is a schematic view of a process in which dangling bonds are formed between a cleaned first substrate active surface and a cleaned second substrate active surface, and FIG. 12F is a schematic view of a process in which the first substrate active surface and the second substrate active surface are bonded by the room-temperature bonding.

FIGS. 14A to 14C are illustrations of the diffusion bonding method applicable to the method of manufacturing a semiconductor substrate structure according to one embodiment of the present disclosure to which the present technique is applied, in which FIG. 14A is a schematic view of a state in which a bonding agent is arranged on a substrate, FIG. 14B is a schematic view of a state in which a pressurizing/heating process is performed in the state of FIG. 14A to form a diffusion bonding having voids, and FIG. 14C is a schematic view of a state in which the pressurizing/heating process is performed to form a void-free diffusion bonding.

FIGS. 15A to 15C are illustrations of a solid phase diffusion bonding method applicable to the method of manufacturing a semiconductor substrate structure according to one embodiment of the present disclosure to which the present technique is applied, in which FIG. 15A is a schematic view of a state in which a bonding agent is arranged on the substrate via an insert metal layer, FIG. 15B is a schematic view of a state in which a pressurizing/heating process is performed in the state of FIG. 15A to form a solid phase diffusion bonding, and FIG. 15C is a schematic view of a state in which the pressurizing/heating process is further performed to form a solid phase diffusion bonding.

FIGS. 16A and 16C are illustrations of a solid phase diffusion bonding method applicable to the method of manufacturing a semiconductor substrate structure according to one embodiment of the present disclosure to which the present technique is applied, in which FIG. 16A is a schematic view of a state in which a bonding agent is arranged on the substrate via an insert metal layer, FIG. 16C is a schematic view of a state in which the pressurizing/heating process is further performed to form a solid phase diffusion bonding.

FIGS. 17A and 17B are explanatory views of a crystalline state of ceramics, in which FIG. 17A is a schematic view of a polycrystalline body and FIG. 17B is a schematic view of an amorphous non-crystalline solid.

FIGS. 22A and 22B examples of a graphite substrate applicable to the semiconductor substrate structure according to one embodiment of the present disclosure to which the present technique is applied, in which FIG. 22A is a schematic bird's-eye view of the graphite substrate in XY orientation, and FIG. 22B is a schematic bird's-eye view of the graphite substrate in XZ-orientation.

DETAILED DESCRIPTION

Figure 1A:
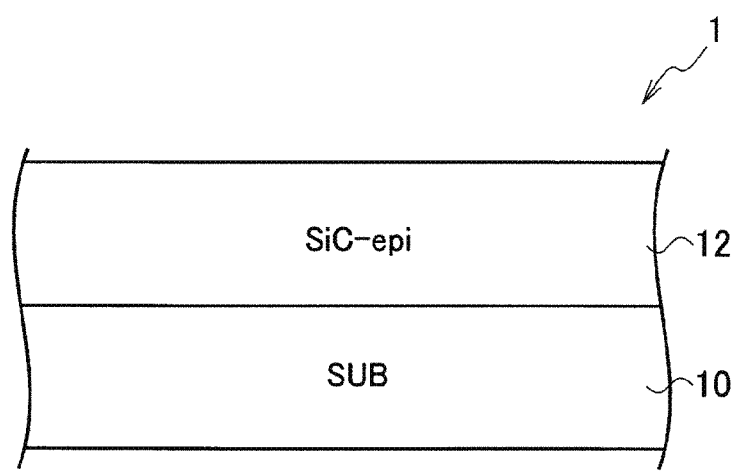
FIG. 1A is a schematic cross-sectional view of a semiconductor substrate structure according to one embodiment of the present disclosure to which the present technique is applied.

Embodiments of the present disclosure will now be described in detail with reference to the drawings. In the description of the drawings described below, like or similar parts are given like or similar reference numerals. However, it should be noted that the drawings are schematics, and the relationship between the thickness and planar dimensions of each component, and the like may differ from reality. Therefore, specific thicknesses and dimensions should be determined in consideration of the following description. Moreover, it is to be understood that parts having different dimension relationships or ratios are included among the drawings.

In addition, the embodiments described below exemplify devices or methods for embodying technical ideas, and do not specify materials, features, structures, arrangements, and the like of each component. These embodiments may be differently modified within the scope of the claims.

Figure 1B:
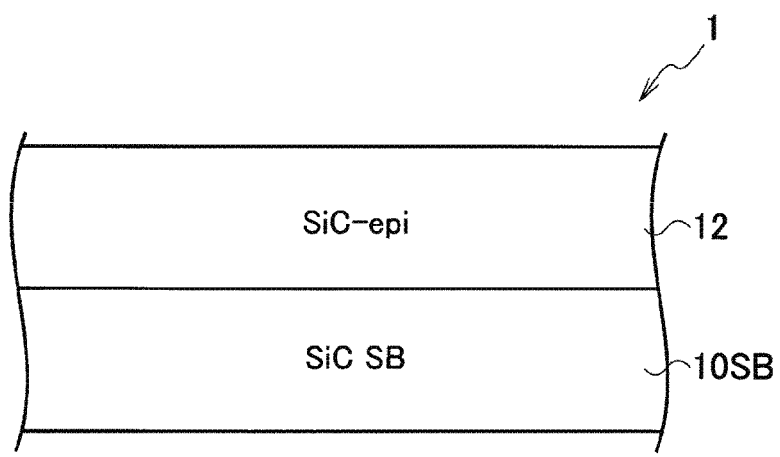
FIG. 1B is another schematic cross-sectional view of the semiconductor substrate structure according to one embodiment of the present disclosure to which the present technique is applied.

A schematic cross-sectional structure of a semiconductor substrate structure according to one embodiment of the present disclosure to which the present technique is applied is illustrated as in FIG. 1A, and another schematic cross-sectional structure of the semiconductor substrate structure is illustrated as in FIG. 1B.

As illustrated in FIG. 1A, a semiconductor substrate structure 1 according to one embodiment of the present disclosure to which the present technique is applied includes a substrate (SUB) 10 and an epitaxial growth layer 12 bonded to a substrate 10, and the substrate 10 and the epitaxial growth layer 12 are bonded by a room-temperature bonding. Here, the room temperature bonding includes at least one or more types selected from a surface activation bonding, a plasma activation bonding, and an atomic diffusion bonding.

The substrate 10 and the epitaxial growth layer 12 may also be bonded by a diffusion bonding. In the examples of FIGS. 1A and 1B, an example of an SiC epitaxial growth layer (SiC-epi) is illustrated as the epitaxial growth layer 12. In the example of FIG. 1B, an example of an SiC sintered body is illustrated as the substrate 10.

The epitaxial growth layer 12 may include at least one or more types selected from a group including group IV element semiconductors, group III-V compound semiconductors, and group II-VI compound semiconductors.

The epitaxial growth layer 12 may also include at least one or more types selected from a group including silicon carbide, gallium nitride, silicon, aluminum nitride, and gallium oxide.

Furthermore, the substrate 10 may include at least one or more types selected from a group including a sintered body, BN, AlN, $Al_2O_3$, $Ga_2O_3$, diamond, carbon, and graphite. Here, the sintered body may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

Figure 2A:
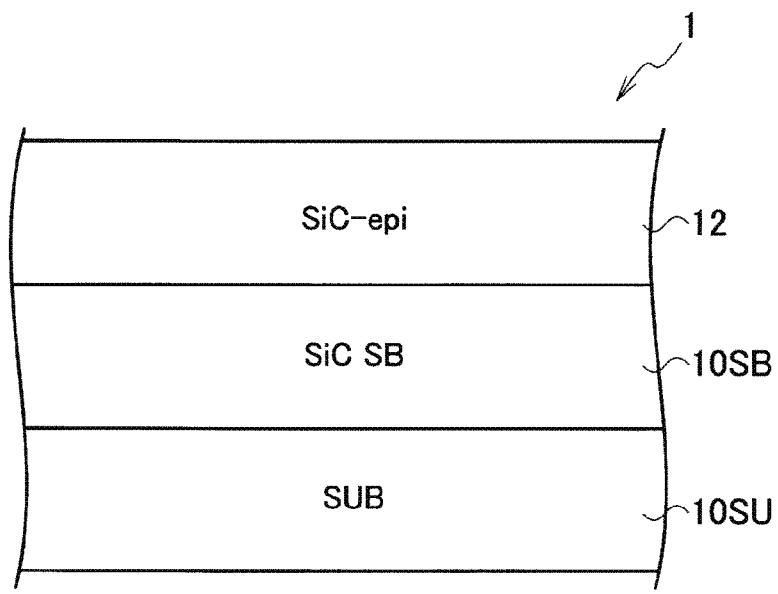
FIG. 2A is another schematic cross-sectional view of the semiconductor substrate structure according to one embodiment of the present disclosure to which the present technique is applied.
Figure 2B:
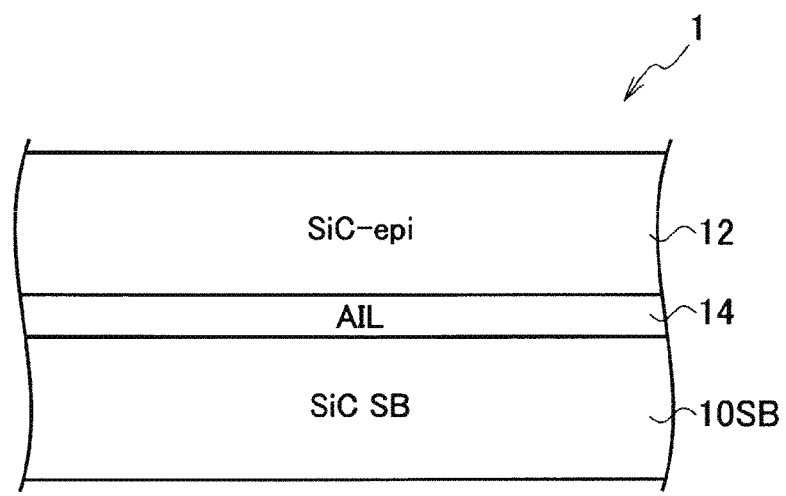
FIG. 2B is yet another schematic cross-sectional view of a semiconductor substrate structure according to one embodiment of the present disclosure to which the present technique is applied.

Yet another schematic cross-sectional structure of the semiconductor substrate structure according to one embodiment of the present disclosure to which the present technique is applied is illustrated as in FIG. 2A, and yet another schematic cross-sectional structure of the semiconductor substrate structure is illustrated as in FIG. 2B. In the examples of FIGS. 2A and 2B, an example of an SiC epitaxial growth layer (SiC-epi) is illustrated as the epitaxial growth layer 12. An example of an SiC sintered body 10SB is illustrated as the substrate 10. Furthermore, in the example of FIG. 2A, the SiC sintered body 10SB is arranged on a support substrate 10SU.

The support substrate 10SU may include at least one or more types selected from a group including a sintered body, BN, AlN, $Al_2O_3$, $Ga_2O_3$, diamond, carbon, and graphite. Here, the sintered body constituting the support substrate 10SU may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

Furthermore, as illustrated in FIG. 2B, the substrate 10 includes a sintered body, and the substrate 10 and the epitaxial growth layer 12 may be bonded via a bonding interface layer 14. The sintered body may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide. In the example of FIG. 2B, the SiC sintered body 10SB and the SiC epitaxial growth layer (SiC-epi) 12 are bonded via the bonding interface layer (AIL) 14.

When a room-temperature bonding is used, a surface roughness Ra of the substrate surface is set to about 1 nm or less. As a result, the thickness of the bonding interface layer (AIL) 14 having a different composition is set to about 1 nm to 10 μm.

When a diffusion bonding is used, the surface roughness of the substrate surface may be coarse depending on a material and a bonding temperature. The thickness of the bonding interface layer (AIL) 14 having a different composition gradient by atomic diffusion is approximately 1 nm to 10 μm in order to use the atomic diffusion.

Figure 3A:
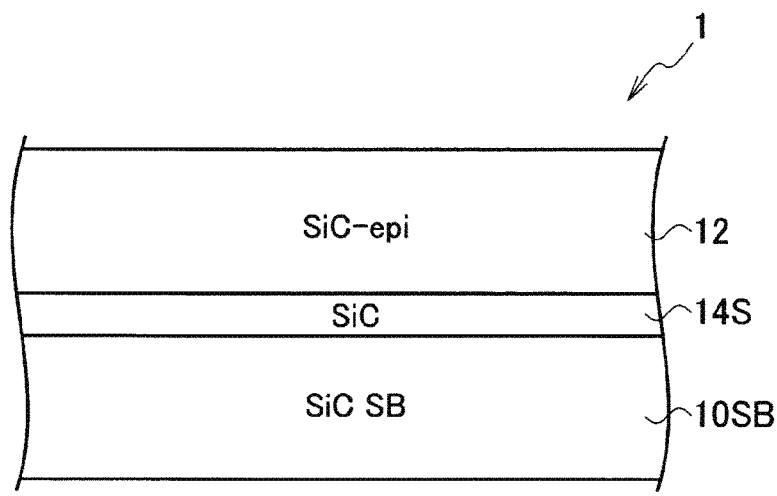
FIG. 3A is another schematic cross-sectional view of the semiconductor substrate structure according to one embodiment of the present disclosure to which the present technique is applied.
Figure 3B:
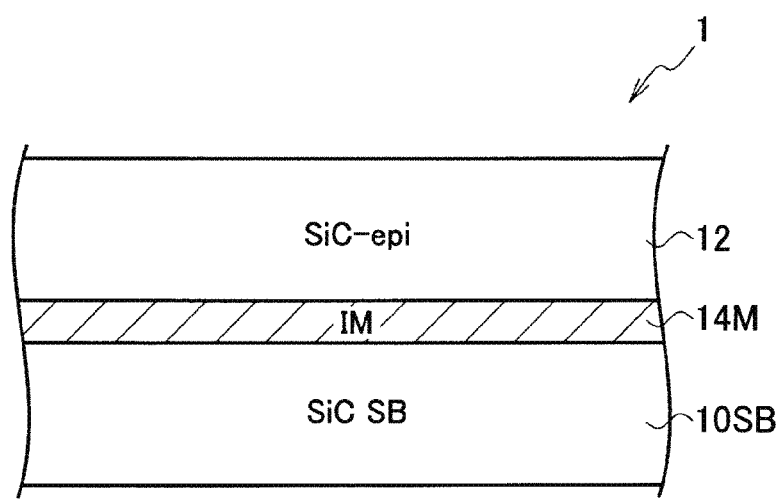
FIG. 3B is yet another schematic cross-sectional view of the semiconductor substrate structure according to one embodiment of the present disclosure to which the present technique is applied.

Yet another schematic cross-sectional structure of the semiconductor substrate structure according to one embodiment of the present disclosure to which the present technique is applied is illustrated as in FIG. 3A, and yet another schematic cross-sectional structure of the semiconductor substrate structure is illustrated as in FIG. 3B. In the example of FIG. 3A, the SiC sintered body 10SB and the SiC epitaxial growth layer 12 are bonded via amorphous SiC as a bonding interface layer 14S. In the example of FIG. 3B, the SiC sintered body 10SB and the SiC epitaxial growth layer 12 are bonded via a metal layer as a bonding interface layer 14M. Here, the thicknesses of the bonding interface layers 14S and 14M are, for example, about 1 nm to about 10 μm.

The bonding interface layer may include at least one or more types of amorphous material selected from a group including group IV element semiconductors, group III-V compound semiconductors, and group II-VI compound semiconductors.

The bonding interface layer may also include at least one or more types of amorphous material selected from a group including silicon carbide, gallium nitride, silicon, aluminum nitride, and gallium oxide.

As illustrated in FIG. 3A, the bonding interface layer 14S may include amorphous SiC.

Furthermore, as illustrated in FIG. 3B, the bonding interface layer 14M may include a metal layer.

Here, the metal layer may include at least one or more types selected from a group including Al, Co, Ni, Nb, Mo, Ru, Rh, Pd, Ag, Ta, W, Re, Os, Ir, Pt, and Au.

In addition, as illustrated in FIGS. 3A and 3B, the substrate 10 includes a silicon carbide sintered body, the epitaxial growth layer 12 includes an SiC epitaxial growth layer (SiC-epi), and the silicon carbide sintered body 10SB and the SiC epitaxial growth layer (SiC-epi) 12 may be bonded via the bonding interface layer 14.

According to the present embodiment, it is possible to provide a semiconductor substrate structure capable of eliminating restrictions on materials, achieving cost reduction and acquiring desired physical properties, and a power semiconductor device including the semiconductor substrate structure.

According to the semiconductor substrate structure of the present embodiment, since the arbitrary substrate and the SiC epitaxial growth layer are bonded to each other using a room-temperature bonding technique or a diffusion bonding technique instead of forming the SiC epitaxial growth layer on the SiC single crystalline substrate, it is possible to expand the range of combinations of the epitaxial growth layer and the substrate.

According to the semiconductor substrate structure of the present embodiment, for example, a low cost SiC polycrystal substrate or a carbon substrate, instead of a high cost SiC single crystalline substrate, can be used as a substrate material.

Furthermore, according to the semiconductor substrate structure of the present embodiment, since the combination of the substrate having the desired characteristics and the SiC epitaxial growth layer is possible, it is possible to improve the characteristics of the power semiconductor device. Specifically, since the thermal expansion coefficient, the thermal conductivity, the electrical conductivity, and the mechanical characteristics can be combined as desired, it is possible to improve the switching characteristics, the heat resistance, and the mechanical reliability of the power semiconductor device.

In addition, according to the semiconductor substrate structure and the power semiconductor device including the semiconductor substrate structure of the present embodiment, since the arbitrary substrate and the completed SiC epitaxial growth layer are bonded to each other using the room-temperature bonding technique or the diffusion bonding technique, it is possible to shorten the period of manufacturing process. Further, since the arbitrary substrate and the completed SiC epitaxial growth layer can be combined, it is possible to improve the manufacturing yield.

(Method of Manufacturing Semiconductor Substrate Structure)

Figure 4A:
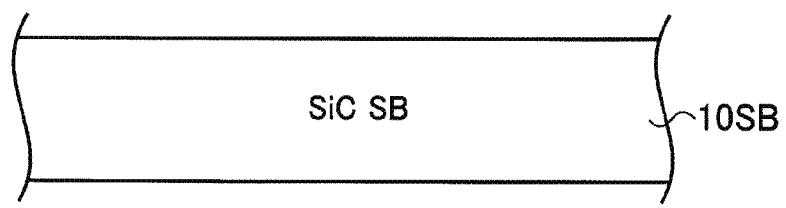
FIG. 4A is an explanatory view of a process of manufacturing a semiconductor substrate structure according to one embodiment of the present disclosure to which the present technique is applied.
Figure 4B:
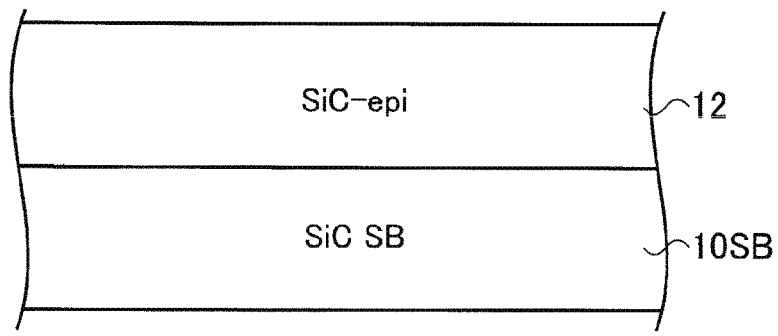
FIG. 4B is an explanatory view of a process of manufacturing a semiconductor substrate structure according to one embodiment of the present disclosure to which the present technique is applied.

A method of manufacturing the semiconductor substrate structure 1 according to one embodiment of the present disclosure to which the present technique is applied is illustrated as in FIGS. 4A and 4B.

(a) First, as illustrated in FIG. 4A, an SiC sintered body 10SB is formed.

(b) Next, an SiC epitaxial growth layer 12 is prepared separately from the SiC sintered body 10SB, and as illustrated in FIG. 4B, the SiC sintered body 10SB and the SiC epitaxial growth layer 12 are bonded to each other by a room-temperature bonding. The SiC sintered body 10SB and the SiC epitaxial growth layer 12 may also be bonded by a diffusion bonding.

Figure 5A:
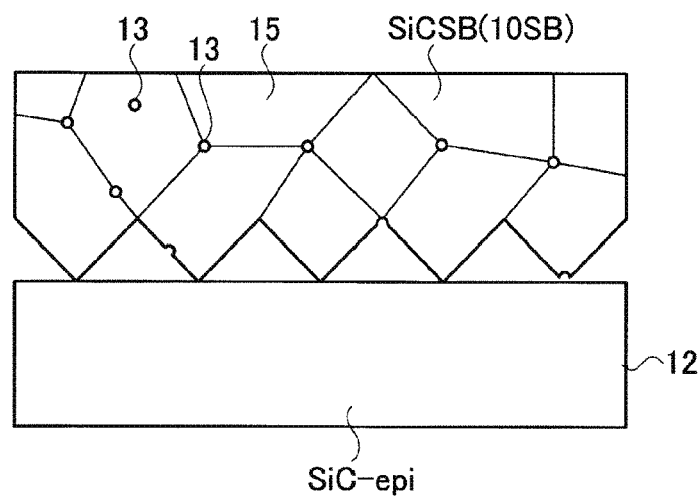

In addition, a schematic cross-sectional structure of a semiconductor substrate structure according to another embodiment of the present disclosure to which the present technique is applied, and of a configuration in which a polycrystalline body is arranged on a single crystalline body, is illustrated as in FIG. 5A. Furthermore, a schematic cross-sectional structure of an ideal configuration in which the single crystalline body and the polycrystalline body are bonded is illustrated as in FIG. 5B.

Figure 5B:
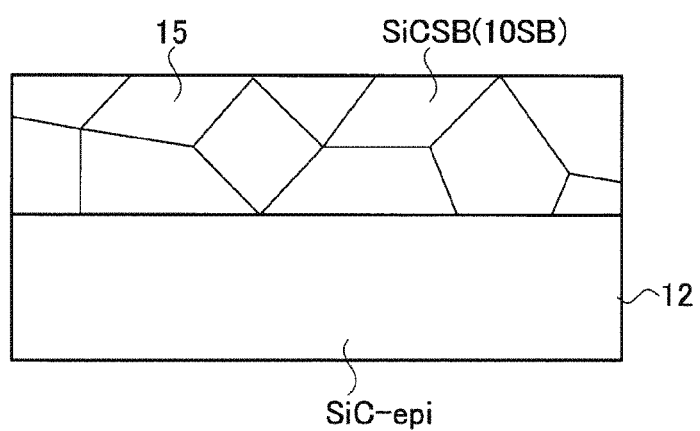

FIGS. 5A and 5B illustrate examples in which the single crystalline body is an SiC epitaxial growth layer (SiC-epi) 12 and the polycrystalline body is an SiC sintered body (SiCSB) 10SB. The SiC polycrystalline body 10SB has a plurality of voids 13 and a plurality of SiC polycrystalline grains 15. Although an example which has a substantially circular shape is illustrated in FIGS. 1A and 1B as the shape of the voids, it is not limited to this shape, but may take any other various shapes such as an elliptical shape.

In the SiC polycrystalline body 10SB, as illustrated in FIG. 5A, since there are recesses and internal voids in its surface, it is difficult to reduce the surface roughness even when the single crystalline body and the polycrystalline body are directly bonded. Therefore, it is difficult to obtain an ideal semiconductor substrate structure as illustrated in FIG. 5B, and the bonding strength is also low.

Figure 6:
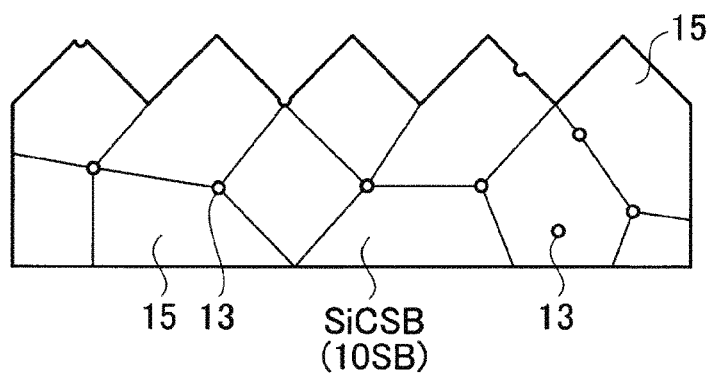
FIG. 6 is an explanatory view of a method of manufacturing a semiconductor substrate structure according to one embodiment of the present disclosure to which the present technique is applied, and is a schematic cross-sectional view of an SiC polycrystalline body.

In the method of manufacturing a semiconductor substrate structure according to one embodiment of the present disclosure to which the present technique is applied, the schematic cross-sectional structure of the SiC polycrystalline body 10SB is illustrated as in FIG. 6.

Figure 7:
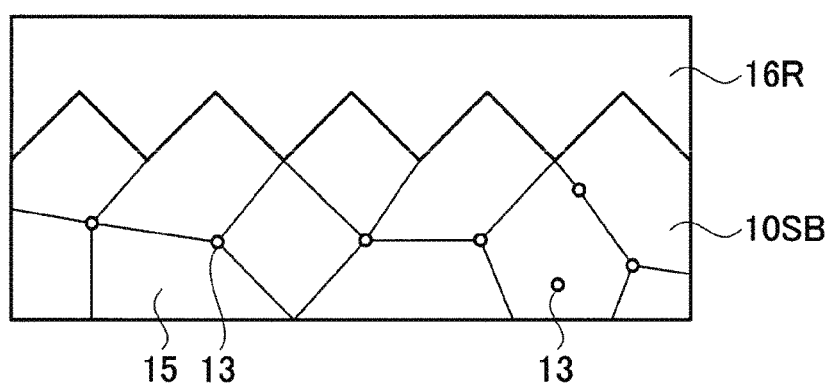
FIG. 7 is an explanatory view of a method of manufacturing a semiconductor substrate structure according to one embodiment of the present disclosure to which the present technique is applied, and is a schematic cross-sectional view of a process of forming a surface roughness improvement layer on the SiC polycrystalline body.

A schematic cross-sectional structure of a process of forming a surface roughness improvement layer 16R on the SiC polycrystalline body 10SB is illustrated as in FIG. 7.

Figure 8:
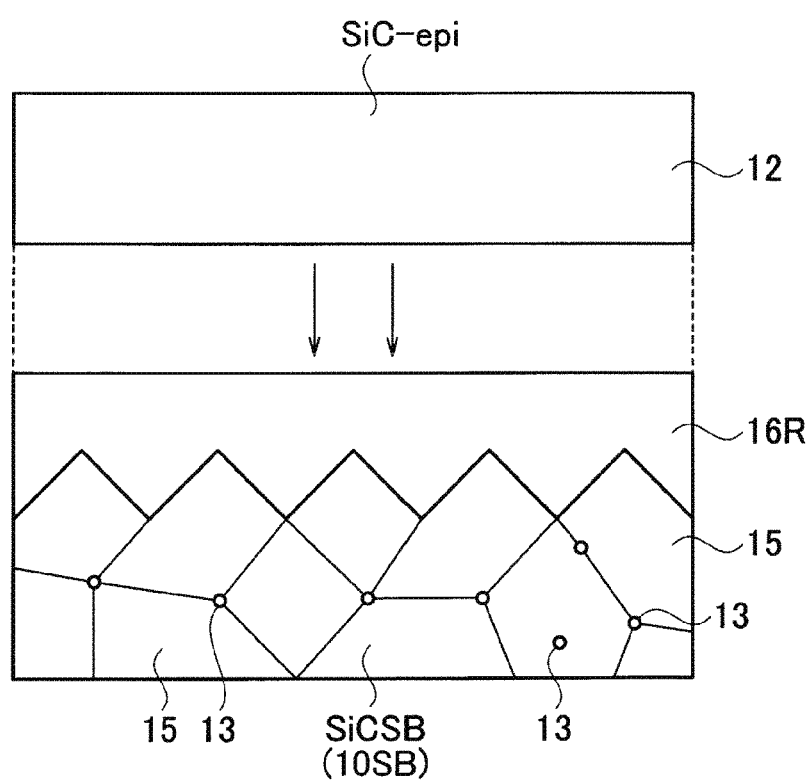
FIG. 8 is an explanatory view of a method of manufacturing a semiconductor substrate structure according to one embodiment of the present disclosure to which the present technique is applied, and is a schematic cross-sectional view of a process of bonding an SiC epitaxial growth layer onto the SiC polycrystalline body via the surface roughness improvement layer.

A schematic cross-sectional structure of a process of bonding an SiC epitaxial growth layer 12 onto the SiC polycrystalline body 10SB via the surface roughness improvement layer 16R is illustrated as in FIG. 8.

Figure 9:
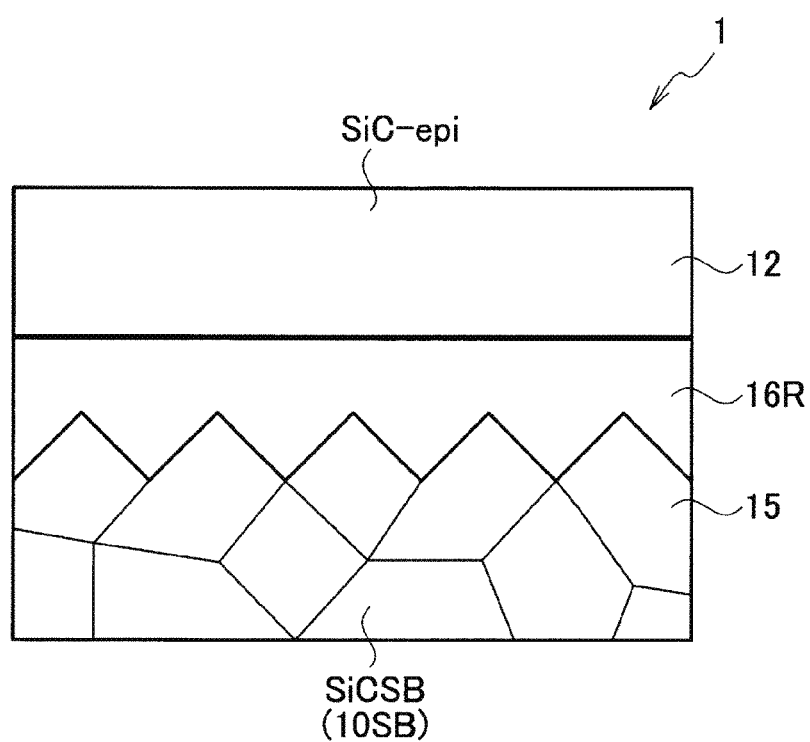
FIG. 9 is a schematic cross-sectional view of the semiconductor substrate structure according to one embodiment of the present disclosure to which the present technique is applied.

A schematic cross-sectional structure of the semiconductor substrate structure 1 according to one embodiment of the present disclosure to which the present technique is applied is illustrated as in FIG. 9.

In the method of manufacturing a semiconductor substrate structure according to one embodiment of the present disclosure to which the present technique is applied, the surface of the SiC sintered body 10SB is capped with the surface roughness improvement layer 16R including a CVD film formed by, for example, a chemical vapor deposition (CVD) method, and the surface roughness Ra of the bonding surface is set to, for example, 1 nm or less. As a technique for setting the surface roughness Ra to 1 nm or less, a chemical mechanical polishing (CMP) technique or a mechanical polishing (MP) technique may be applied.

As illustrated in FIG. 7, a surface from which the voids 13 in the surface roughness improvement layer 16R are not exposed may be formed by burying the recesses in the surface of the SiC sintered body 10SB with the surface roughness improvement layer 16R and polishing the surface of the surface roughness improvement layer 16R.

As illustrated in FIG. 9, the semiconductor substrate structure 1 according to one embodiment of the present disclosure to which the present technique is applied includes the substrate 10SB, the surface roughness improvement layer 16R arranged on the substrate 10SB, and the single crystalline body 12 bonded to the substrate 10SB by the room-temperature bonding via the surface roughness improvement layer 16R. Here, the room-temperature bonding includes at least one or more types selected from a surface activation bonding, a plasma activation bonding, and an atomic diffusion bonding.

The substrate 10SB and the single crystalline body 12 may also be diffusion-bonded.

When the room-temperature bonding is used, the surface roughness Ra of the substrate surface is set to about 1 nm or less. As a result, the thickness of the surface roughness improvement layer 16R having a different composition is set to about 1 nm to 10 µm.

When the diffusion bonding is used, the surface roughness of the substrate surface may be coarse depending on a material and a bonding temperature. The thickness of the surface roughness improvement layer 16R having a different composition gradient by atomic diffusion is approximately 1 nm to about 10 µm in order to use the atomic diffusion.

The single crystalline body 12 may be a single crystalline wafer or an epitaxial growth layer.

Furthermore, the single crystalline body 12 may include at least one or more types selected from a group including group IV element semiconductors, group III-V compound semiconductors, and group II-VI compound semiconductors.

The single crystalline body 12 may also include at least one or more types selected from a group including silicon carbide, gallium nitride, silicon, aluminum nitride, and gallium oxide.

In addition, the substrate 10SB may include at least one or more types selected from a group including a sintered body, BN, AlN, $Al_2O_3$, $Ga_2O_3$, diamond, carbon, and graphite. Here, the sintered body may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

The surface roughness improvement layer 16R may include a CVD film formed by a CVD method.

The surface roughness improvement layer 16R may also include a film formed by a sol-gel method or a dip method.

Also, the surface roughness improvement layer 16R may include the same type of material as the substrate 10SB.

Furthermore, the single crystalline body 12 may include the same type of material as the surface roughness improvement layer 16R.

In addition, the surface roughness improvement layer 16R may include a metal layer.

Here, the metal layer may include at least one or more types selected from a group including Al, Co, Ni, Nb, Mo, Ru, Rh, Pd, Ag, Ta, W, Re, Os, Ir, Pt, and Au.

Further, the surface roughness improvement layer 16R may include at least one or more types of amorphous material selected from a group including group IV element semiconductors, group III-V compound semiconductors, and group II-VI compound semiconductors.

Further, the surface roughness improvement layer 16R may include at least one or more types of amorphous material selected from a group including silicon carbide, gallium nitride, silicon, aluminum nitride, and gallium oxide.

Further, the thickness of the surface roughness improvement layer 16R may be 1 nm or more.

In the semiconductor substrate structure according to one embodiment of the present disclosure to which the present technique is applied, since the surface roughness improvement layer is formed by a chemical reaction without using a bonding agent or a molten material, the surface roughness improvement layer can be made of the same type of material as the substrate material.

In the semiconductor substrate structure according to one embodiment of the present disclosure to which the present technique is applied, a material which is stable at high temperature may be used. For example, SiC may be used because it is not melted or decomposed even in high temperature semiconductor processes.

In the semiconductor substrate structure according to one embodiment of the present disclosure to which the present technique is applied, since same materials as the materials to be bonded may be used, it is possible to eliminate a difference and a need for adjusting the thermal expansion coefficient, the electrical conductivity, the thermal conductivity, and the mechanical characteristics, and to improve characteristics, shorten a development time, and improve reliability.

Figure 10A:
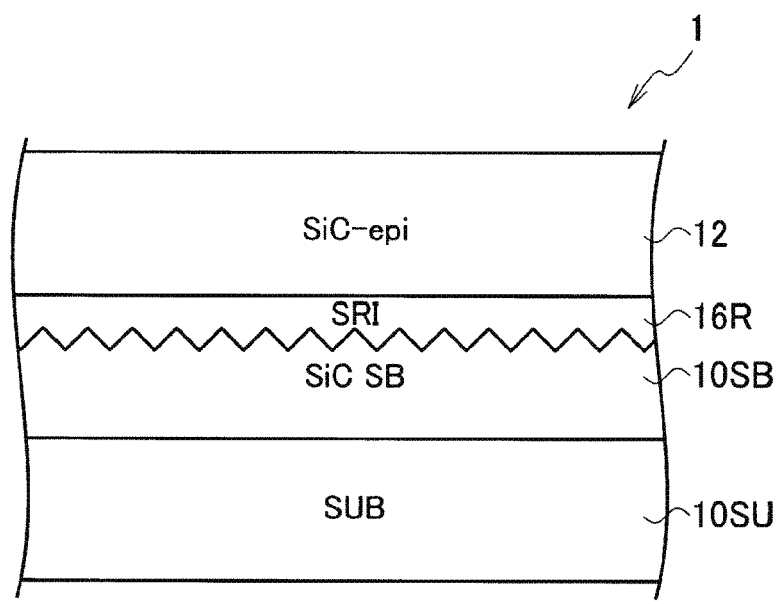
FIG. 10A is another schematic cross-sectional view of the semiconductor substrate structure according to one embodiment of the present disclosure to which the present technique is applied.
Figure 10B:
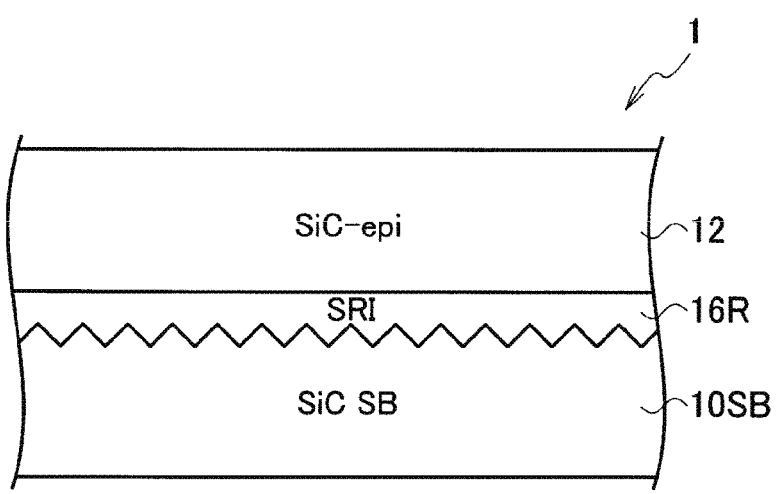
FIG. 10B is yet another schematic cross-sectional view of the semiconductor substrate structure according to one embodiment of the present disclosure to which the present technique is applied.

A schematic cross-sectional structure of the semiconductor substrate structure according to one embodiment of the present disclosure to which the present technique is applied is illustrated as in FIG. 10A, and another schematic cross-sectional structure of the semiconductor substrate structure is illustrated as in FIG. 10B.

In the examples of FIGS. 10A and 10B, an example in which the epitaxial growth layer 12 is an SiC epitaxial growth layer and the substrate 10SB is an SiC sintered body 10SB is illustrated. Furthermore, in the example of FIG. 10A, the SiC sintered body 10SB is arranged on the support substrate 10SU.

The support substrate 10SU may include at least one or more types selected from a group including a sintered body, BN, AlN, $Al_2O_3$, $Ga_2O_3$, diamond, carbon, and graphite. Here, the sintered body constituting the support substrate 10SU may include one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

Furthermore, as illustrated in FIGS. 10A and 10B, the substrate 10SB and the epitaxial growth layer 12 are bonded by the room-temperature bonding or diffusion bonding via the surface roughness improvement layer (SRI) 16R.

In the semiconductor substrate structure according to one embodiment of the present disclosure to which the present technique is applied, the SiC polycrystalline body and the SiC epitaxial growth layer can be bonded via the surface roughness improvement layer, and a stable bonding can be formed even under a high temperature environment where the bonding agent is decomposed.

Figure 11A:
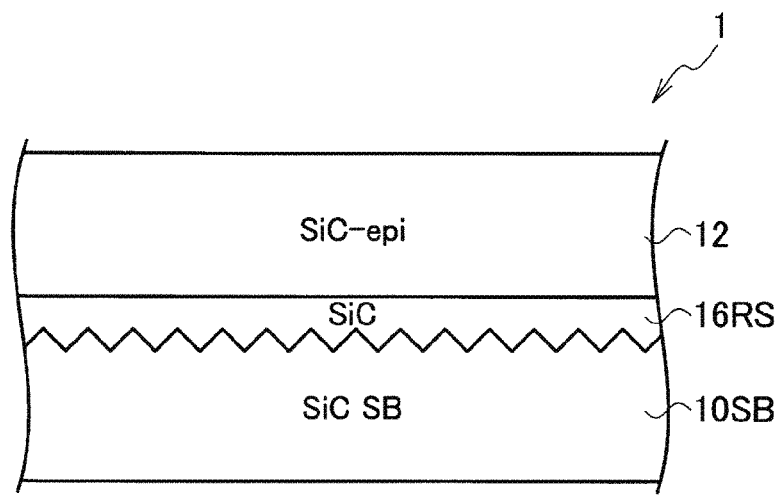
FIG. 11A is another schematic cross-sectional view of the semiconductor substrate structure according to one embodiment of the present disclosure to which the present technique is applied.
Figure 11B:
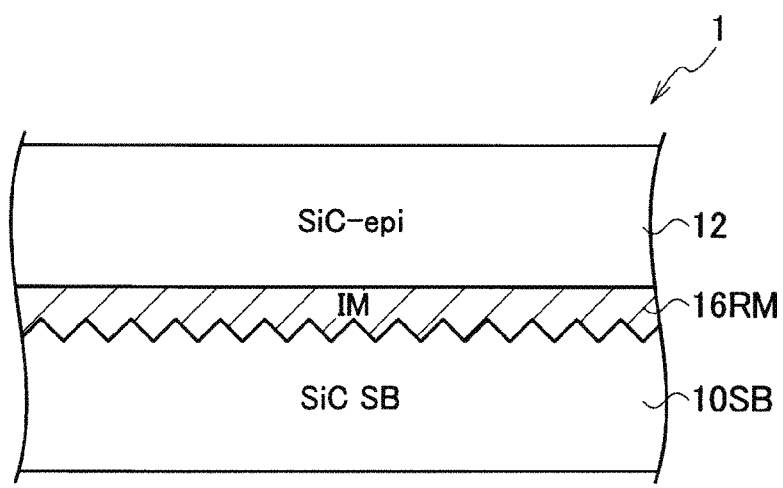
FIG. 11B is yet another schematic cross-sectional view of the semiconductor substrate structure according to one embodiment of the present disclosure to which the technique is applied.

Another schematic cross-sectional structure of a semiconductor substrate structure according to one embodiment of the present disclosure to which the present technique is applied is illustrated as in FIG. 11A, and yet another schematic cross-sectional structure of the semiconductor substrate structure is illustrated as in FIG. 11B.

In the example of FIG. 11A, the SiC sintered body 10SB and the SiC epitaxial growth layer (SiC-epi) 12 are bonded by the room-temperature or diffusion bonding via an amorphous SiC layer 16RS as the surface roughness improvement layer. In the example of FIG. 11B, the SiC sintered body 10SB and the SiC epitaxial growth layer 12 are bonded by the room-temperature or diffusion bonding via a metal layer 16RM as the surface roughness improvement layer.

Here, the metal layer may include at least one or more types selected from a group including Al, Co, Ni, Nb, Mo, Ru, Rh, Pd, Ag, Ta, W, Re, Os, Ir, Pt, and Au.
(Room-Temperature Bonding Technique)

The room-temperature bonding technique includes a surface activation bonding technique, a plasma activation bonding technique, an atomic diffusion bonding technique, and the like. The room-temperature bonding technique is a technique that forms an interatomic bonding at a room temperature by removing oxides and adsorbed molecules on a solid surface by a sputtering effect using a high-speed atom beam or the like in a vacuum state to activate the surface and then bringing the active surfaces into contact with each other. In the room-temperature bonding technique, the bonding surface is a surface processed in a vacuum state to bring the surface atoms into an active state in which the chemical bonding is easy to be formed. The room-temperature bonding technique directly bonds dangling bonds of the surface atoms by removing the surface layer that interferes with the bonding to form a strong bonding. Many materials may be bonded at a room temperature by using the room-temperature bonding technique.

The semiconductor materials may be applied to, for example, homo bonding of Si, SiC, GaAs, InP, GaP, InAs or the like, and hetero bonding between these materials. A single crystalline oxide may be applied to $Si/LiNbO_3$, $Si/LiTaO_3$, $Si/Gd_3Ga_5O_{12}$, $Si/Al_2O_3$ (sapphire), or the like. The metal may be applied to a bulk material, foil, bump, or the like of Au, Pt, Ag, Cu, Al, Sn, Pb, Zn, and solder. In addition, Au, Pt, Cu, and Al may be applied to film materials or the like prepared on the substrate. Further, the metal/ceramic structure may be applied to hetero material bonding of Al such as $Al/Al_2O_3$, Al/silicon nitride, Al/SiC, Al/AlN, or the like.

The room temperature bonding technique requires that the bonding surface be clean and smooth at the atomic level. Therefore, the surface roughness Ra of the surface to be bonded may be, for example, 1 nm or less in some embodiments. As a technique for setting the surface roughness Ra to, for example, 1 nm or less, a CMP technique or an MP technique may be applied. In addition, a high-speed atomic beam irradiation technique of argon in which an ion beam is neutralized, or the like may be applied.

For the removal of the surface layer, for example, sputter etching by ion beam, plasma or the like may be applied. The surface after the sputter etching is in a state in which it also easily reacts with surrounding gas molecules. An inert gas such as argon is used for the ion beam, and the process is performed in a vacuum chamber exhausted in a high vacuum. The surface from which the atoms having dangling bonds after the sputter etching are exposed is in an active state in which the bond strength with other atoms is large, and a strong bonding may be obtained at the room temperature by bonding them.

In the description of the room-temperature bonding applicable to the method of manufacturing a semiconductor substrate structure according to one embodiment of the present disclosure to which the present technique is applied, a first substrate 200 covered with a contaminant layer 200C is schematically illustrated as in FIG. 12A, and a second substrate 300 covered with a contaminant layer 300C is schematically illustrated as in FIG. 12B.

An etching process of the first substrate surface covered with the contaminant layer 200C is schematically illustrated as in FIG. 12C, and an etching process of the second substrate surface covered with the contaminant layer 300C is schematically illustrated as in FIG. 12D. Here, the etching process is performed by high-speed atom beam irradiation from a high-speed argon ion beam generator 400.

Further, a state in which dangling bonds BD are formed between the cleaned first substrate active surface and the cleaned second substrate active surface is schematically illustrated as in FIG. 12E. The process in which the first substrate active surface and the second substrate active surface are bonded by the room-temperature bonding is schematically illustrated as in FIG. 12F. Here, the processes from FIGS. 12C to 12F are all performed in a high vacuum state.

Here, the first substrate may be, for example, the epitaxial growth layer 12 of the semiconductor substrate structure 1 according to one embodiment of the present disclosure to which the present technique is applied, and the second substrate may be, for example, the substrate 10 of the semiconductor substrate structure 1 according to one embodiment of the present disclosure to which the present technique is applied.

In the room-temperature bonding technique, the bonding interface layer is arranged between the cleaned first substrate active surface and the cleaned second substrate active surface, and the first substrate active surface and the second substrate active surface may also be bonded by the room-temperature bonding via the bonding interface layer. As the bonding interface layer, as illustrated in FIG. 3A, the amorphous SiC layer 14S may be applied, and as illustrated in FIG. 3B, the metal layer 14M may be applied.

In the room-temperature bonding technique, the surface roughness improvement layer is arranged between the cleaned first substrate active surface and the cleaned second substrate active surface, and the first substrate active surface and the second substrate active surface may also be bonded by the room-temperature bonding via the surface roughness improvement layer. The surface roughness improvement layer may include a CVD film formed by a CVD method. The surface roughness improvement layer may also include the same type of material as the substrate. The layers to be bonded may include the same type of material as the surface roughness improvement layer. Further, as the surface roughness improvement layer, the amorphous SiC layer may be applied or the metal layer may be applied.

According to the method of manufacturing a semiconductor substrate structure of one embodiment of the present disclosure to which the present technique is applied, since the damage to the bonding interface is small, the productivity with a high yield can be obtained.

(Diffusion Bonding Technique)

The diffusion bonding technique is a technique that bonds base materials using diffusion of atoms generated on a bonding surface by bringing the base materials into close contact with each other and pressurizing the same to such an extent that plastic deformation does not occur as much as possible under a temperature condition equal to or lower than a melting point of the base materials.

Figure 13:
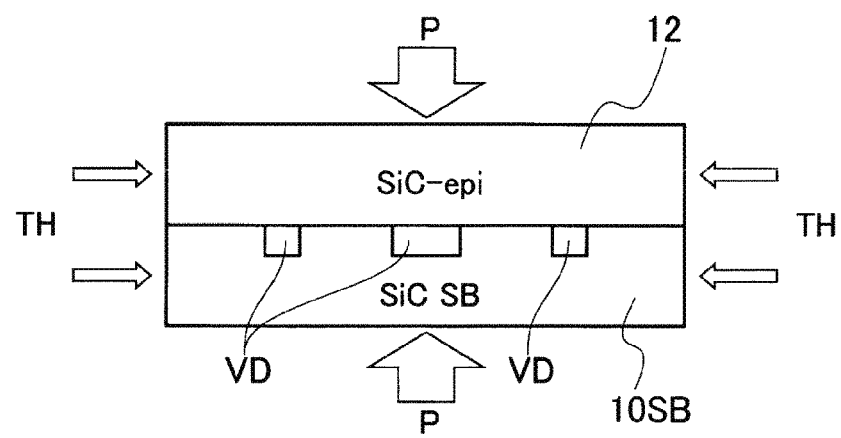
FIG. 13 is an explanatory view of a diffusion bonding method applicable to the method of manufacturing a semiconductor substrate structure according to one embodiment of the present disclosure to which the present technique is applied.

An explanatory view of a diffusion bonding method applicable to the method of manufacturing a semiconductor substrate structure according to one embodiment of the present disclosure to which the present technique is applied is illustrated as in FIG. 13.

When the diffusion bonding is performed, the materials to be bonded are heated and pressurized by bringing the materials into close contact with each other in a controlled atmosphere such as vacuum or an inert gas. A heating temperature TH is, for example, about 200 to 350 degrees C., and a pressurizing pressure P is, for example, about 10 to 80 MPa.

In the example of FIG. 13, an example in which the SiC polycrystalline body 10SB and the SiC epitaxial growth layer 12 are diffusion bonded by heating and pressurizing is illustrated. In the example of FIG. 13, an example having voids VD at the bonding interface is illustrated.

Figure 14A:
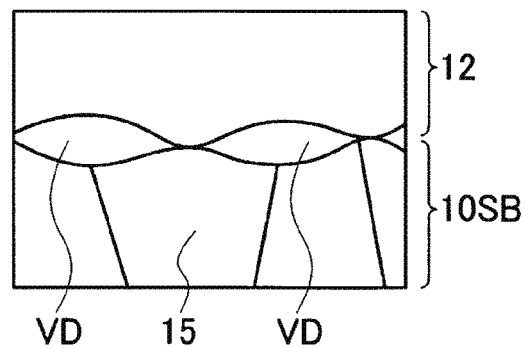

In the description of the diffusion bonding method applicable to the method of manufacturing a semiconductor substrate structure according to one embodiment of the present disclosure to which the present technique is applied, a configuration in which the SiC polycrystalline body 10SB is applied as the substrate and the SiC epitaxial growth layer 12 is arranged as a bonding agent on the SiC polycrystalline body 10SB is schematically illustrated as in FIG. 14A. The SiC polycrystalline body 10SB includes a plurality of SiC polycrystalline grains 15.

Figure 14B:
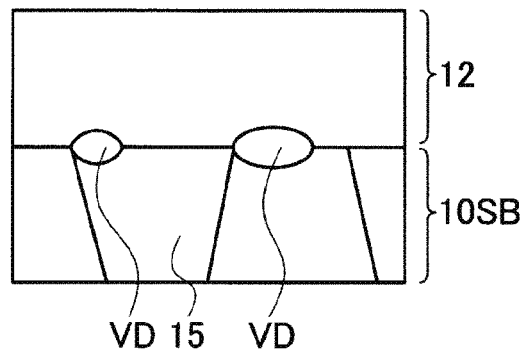
Figure 14C:
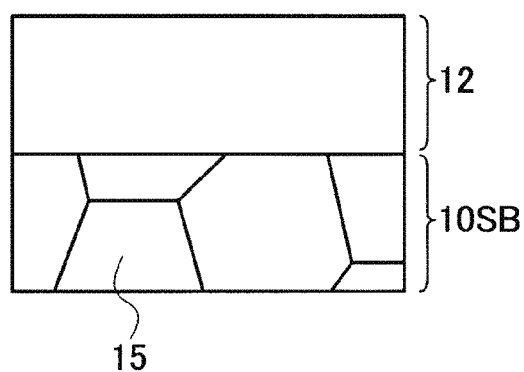

A configuration in which a pressurizing/heating process is performed in the configuration of FIG. 14A is schematically illustrated as in FIG. 14B, and a configuration in which the pressurizing/heating process is further performed in the configuration of FIG. 14B and the diffusion bonding is performed is schematically illustrated as in FIG. 14C. FIG. 14B is an example in which the voids VD are formed at the diffusion bonding interface, and FIG. 14C is an example in which a void-free diffusion bonding is formed. As illustrated in FIGS. 14A to 14C, in the diffusion bonding, the voids in the bonding portion are eliminated as the bonding progresses.

In the diffusion bonding, the substrate and the bonding agent may also be bonded via the bonding interface layer. As the bonding interface layer, as illustrated in FIG. 3A, the amorphous SiC layer 14S may be applied, and as illustrated in FIG. 3B, the metal layer 14M may be applied.

In the diffusion bonding, a metal layer may be sandwiched between the bonding surfaces in order to promote bonding. This metal layer will be referred to as an insert metal layer.

In the diffusion bonding, the substrate and the bonding agent may also be bonded via the surface roughness improvement layer 16R. As the surface roughness improvement layer 16R, as illustrated in FIG. 11A, the amorphous SiC layer 16RS may be applied between the bonding surfaces in order to promote bonding, and as illustrated in FIG. 11B, the metal layer 16RM may be applied. This metal layer 16RM will be referred to as an insert metal layer.

Figure 15A:
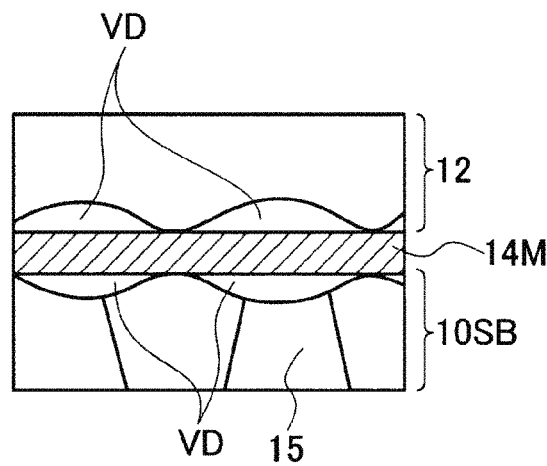

In the description of a solid phase diffusion bonding method applicable to the method of manufacturing a semiconductor substrate structure according to one embodiment of the present disclosure to which the present technique is applied, a configuration in which the bonding agent is arranged on the substrate via the insert metal layer 14M is schematically illustrated as in FIG. 15A. The SiC polycrystalline body 10SB is applied as the substrate, and the SiC epitaxial growth layer 12 is applied as the bonding agent.

Figure 15B:
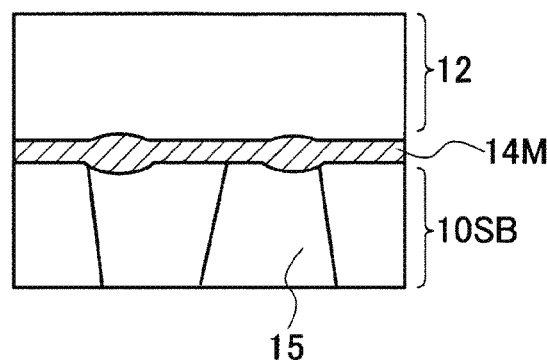
Figure 15C:
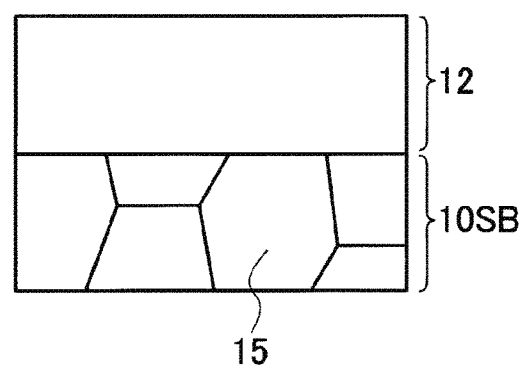

A configuration in which the pressurizing/heating process is performed in the configuration of FIG. 15A to form the solid phase diffusion bonding is schematically illustrated as in FIG. 15B, and a configuration in which the pressurizing/heating process is further performed in the configuration of FIG. 15B to perform the solid phase diffusion bonding is schematically illustrated as in FIG. 15C. In the solid phase diffusion bonding, the insert metal layer 14M is bonded in a solid phase state.

Figure 16A:
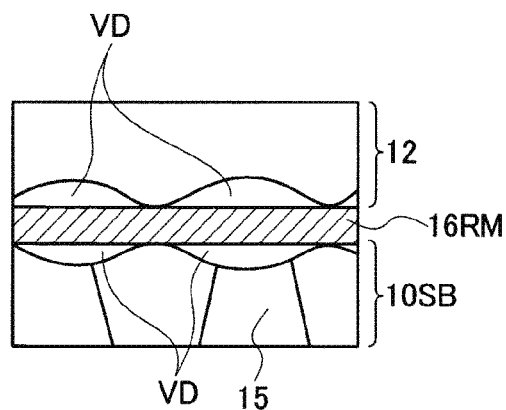

In addition, in the description of the solid phase diffusion bonding method applicable to the method of manufacturing a semiconductor substrate structure according to another embodiment of the present disclosure to which the present technique is applied, a configuration in which a bonding agent is arranged on the substrate via the insert metal layer 16RM is schematically illustrated as in FIG. 16A. The SiC polycrystalline body 10SB is applied as the substrate, and the SiC epitaxial growth layer 12 is applied as the bonding agent.

Figure 16B:
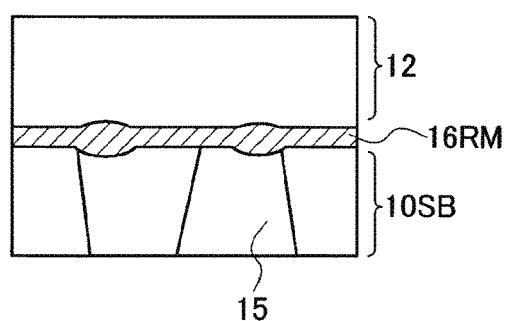
FIG. 16B is a schematic view of a state in which a pressurizing/heating process is performed in the state of FIG. 16A to form a solid phase diffusion bonding.
Figure 16C:
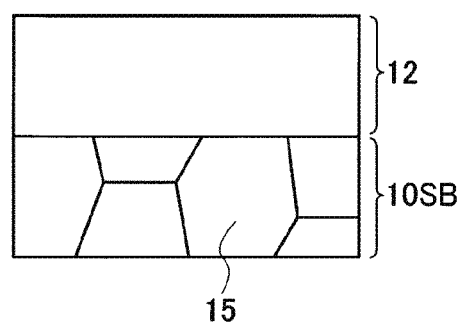

A configuration in which the pressurizing/heating process is performed in the configuration of FIG. 16A to form the solid phase diffusion bonding is schematically illustrated as in FIG. 16B, and a configuration in which the pressurizing and heating process are further performed in the configuration of FIG. 16B to perform the solid phase diffusion bonding to proceed is schematically illustrated as in FIG.

16C. In the solid phase diffusion bonding, the insert metal layer 16RM is bonded in a solid phase state.

In the diffusion bonding and the solid phase diffusion bonding, the cleaning and adhesion on the bonding surface are promoted during the bonding process, and the cleaning and adhesion are simultaneously performed. Both the cleaning process and the adhesion process in the diffusion bonding are due to the diffusion phenomenon.

Here, when the amorphous SiC layer 14S is applied as the bonding interface layer or the amorphous SiC layer 16RS is applied as the surface roughness improvement layer, since the amorphous SiC layer is melted to form a bonding, a liquid phase diffusion bonding or a transient liquid phase diffusion bonding (TLP) is formed.

(Crystalline State of Ceramics)

Figure 17A:
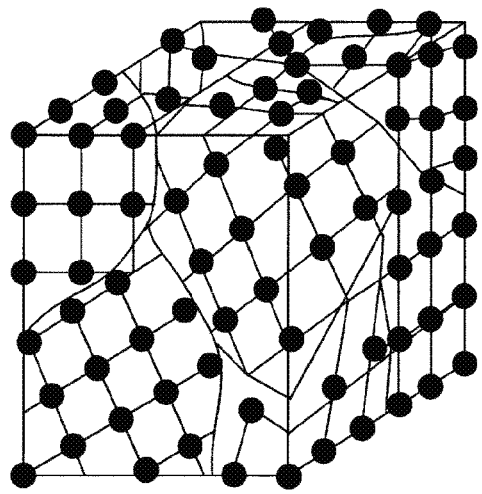
Figure 17B:
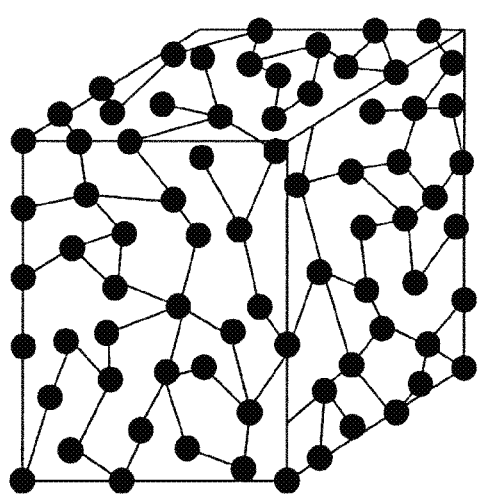

In an explanatory view of the crystalline state of ceramics, an example of a polycrystalline body is schematically illustrated as in FIG. 17A, and an example of an amorphous solid is schematically illustrated as in FIG. 17B. Here, the crystalline state of the SiC polycrystalline body is a crystalline solid, and is schematically illustrated in the same manner as in FIG. 17A, while the crystalline state of the amorphous SiC is an amorphous solid, and is schematically illustrated as in FIG. 17B.

(Apparatus for Manufacturing SiC Sintered Body)

Figure 18:
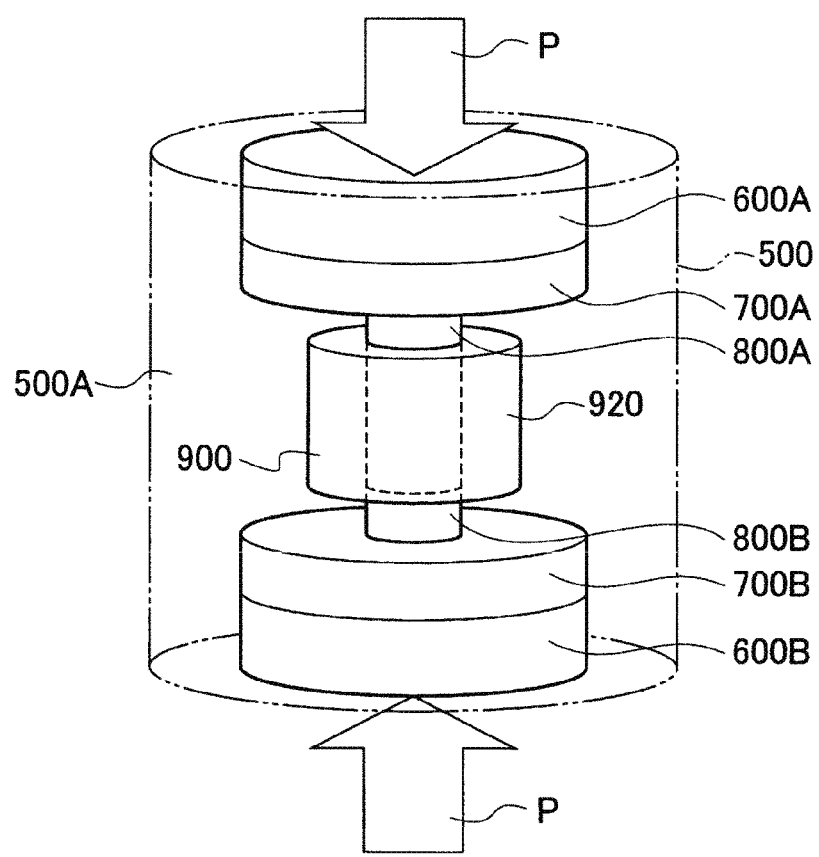
FIG. 18 is a schematic view of an apparatus for manufacturing a polycrystalline body (SiC sintered body) of the semiconductor substrate structure according to one embodiment of the present disclosure to which the present technique is applied.

An apparatus 500 for manufacturing a polycrystalline body (SiC sintered body) of the semiconductor substrate structure according to one embodiment of the present disclosure to which the present technique is applied is schematically illustrated as in FIG. 18. An interior 500A of the apparatus 500 of manufacturing the polycrystalline body (SiC sintered body) is substituted by a vacuum atmosphere of about several Pa or with an Ar/$N_2$ gas.

The apparatus 500 of manufacturing the polycrystalline body (SiC sintered body) employs a solid compression sintering method by hot press sintering (HP). A sintering mold made of graphite (graphite die) 900 filled with a powder or solid SiC polycrystalline body material 940 is heated while being pressurized. A thermocouple or a radiation thermometer 920 is stored in the graphite die 900.

The graphite die 900 is connected to pressing shafts 600A and 600B via graphite bunches 800A and 800B and graphite spacers 700A and 700B. The SiC polycrystalline body material 940 is pressurized and heated by pressurizing between the pressing shafts 600A and 600B. The heating temperature is, for example, about 200 to 350 degrees C., and the pressurizing pressure P is, for example, about 50 MPa at the maximum. For example, spark plasma sintering (SPS), other than the hot press sintering (HP), may also be applied.

According to the apparatus 500 for manufacturing a polycrystalline body (SiC sintered body) of the semiconductor substrate structure of one embodiment of the present disclosure to which the present technique is applied, since the heating range is limited, the temperature rise and cooling can be performed more quickly (several minutes to several hours) than the atmosphere heating such as in an electric furnace. The dense SiC sintered body suppressed in grain growth can be manufactured by the pressurization and quick temperature rise. Moreover, the apparatus 500 may be applied not only to sintering but also to sintering bonding and porous body sintering, and the like.

(Graphite Substrate)

Figure 19:
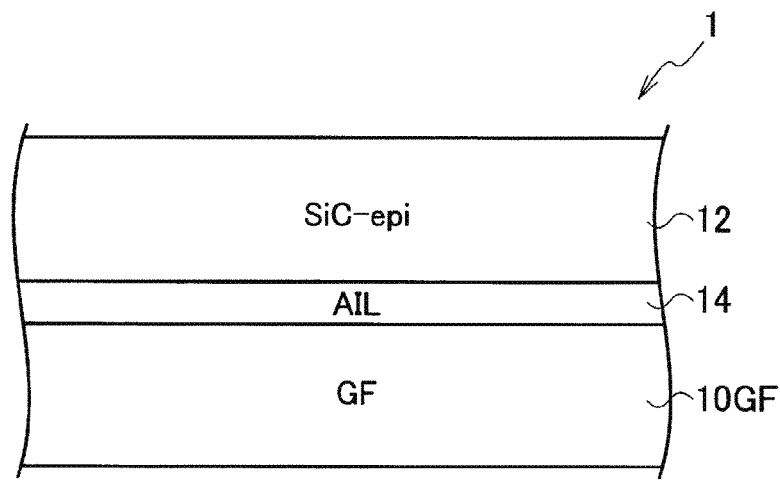
FIG. 19 is a schematic cross-sectional view of the semiconductor substrate structure according to one embodiment of the present disclosure to which the present technique is applied.

The semiconductor substrate structure 1 according to one embodiment of the present disclosure to which the present technique is applied includes a graphite substrate 10GF and the epitaxial growth layer 12 bonded to the graphite substrate 10GF, as illustrated in FIG. 19, in which the graphite substrate 10GF and the epitaxial growth layer 12 are bonded by the room-temperature bonding. Here, the room-temperature bonding includes at least one or more types selected from a surface activation bonding, a plasma activation bonding, and an atomic diffusion bonding.

The graphite substrate 10GF and the epitaxial growth layer 12 may also be bonded by the diffusion bonding.

The epitaxial growth layer 12 may include at least one or more types selected from a group including group IV element semiconductors, group III-V compound semiconductors, and group II-VI compound semiconductors.

The epitaxial growth layer 12 may also include at least one or more types selected from a group including silicon carbide, gallium nitride, silicon, aluminum nitride, and gallium oxide.

Furthermore, the substrate 10 may include at least one or more types selected from a group including a sintered body, BN, AlN, $Al_2O_3$, $Ga_2O_3$, diamond, carbon, and graphite. Here, the sintered body may include at least one or more types of sintered bodies selected from a group including group IV element semiconductors, group III-V compound semiconductors, and group II-VI compound semiconductors. The sintered body may also include at least one or more types of sintered bodies selected from a group including silicon carbide, gallium nitride, silicon, aluminum nitride, and gallium oxide.

The graphite substrate 10GF and the silicon carbide epitaxial growth layer 12 may also be bonded via the bonding interface layer 14.

When the room-temperature bonding is used, the surface roughness Ra of a surface of the graphite substrate 10GF is set to about 1 nm or less. As a result, the thickness of the bonding interface layer (AIL) 14 having a different composition is set to about 1 nm to 10 μm.

When the diffusion bonding is used, the surface roughness may be coarse depending on a material and a bonding temperature. The thickness of the bonding interface layer (AIL) 14 having a different composition gradient by atomic diffusion is approximately 1 nm to 10 μm in order to use the atomic diffusion.

Further, the bonding interface layer 14 may include a metal layer.

Here, the metal layer may include at least one or more types selected from a group including Al, Co, Ni, Nb, Mo, Ru, Rh, Pd, Ag, Ta, W, Re, Os, Ir, Pt, and Au.

The bonding interface layer 14 may include at least one or more types of amorphous material selected from a group including group IV element semiconductors, group III-V compound semiconductors, and group II-VI compound semiconductors.

The bonding interface layer may also include at least one or more types of amorphous material selected from a group including silicon carbide, gallium nitride, silicon, aluminum nitride, and gallium oxide.

(Graphite Substrate)

Figure 20:
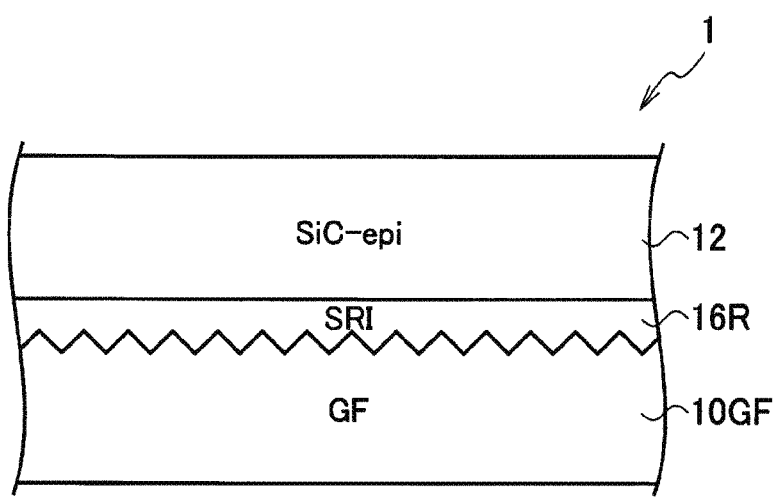
FIG. 20 is a schematic cross-sectional structural view of the semiconductor substrate structure according to one embodiment of the present disclosure to which the present technique is applied.

Furthermore, the semiconductor substrate structure 1 according to another embodiment of the present disclosure to which the present technique is applied includes the graphite substrate 10GF, the surface roughness improvement layer 16R arranged thereon, and a single crystalline body 12 bonded to the graphite substrate 10GF by the room-temperature bonding via the surface roughness improvement layer 16R, as illustrated in FIG. 20. Here, the room-temperature bonding includes at least one or more types selected from a surface activation bonding, a plasma activation bonding, and an atomic diffusion bonding.

The graphite substrate 10GF and the single crystalline body 12 may also be bonded by the diffusion bonding.

When the room temperature bonding is used, the surface roughness Ra of the surface of the graphite substrate 10GF is set to about 1 nm or less. As a result, the thickness of the surface roughness improvement layer 16R having a different composition is set to about 1 nm to 10 μm.

When the diffusion bonding is used, the surface roughness may be coarse depending on a material and a bonding temperature. The thickness of the surface roughness improvement layer 16R having a different composition gradient by atomic diffusion is approximately 1 nm to about 10 μm in order to use the atomic diffusion.

The single crystalline body 12 may be a single crystalline wafer or an epitaxial growth layer.

The single crystalline body 12 may also include at least one or more types selected from a group including group IV element semiconductors, group III-V compound semiconductors, and group II-VI compound semiconductors.

Also, the single crystalline body 12 may include at least one or more types selected from a group including silicon carbide, gallium nitride, silicon, aluminum nitride, and gallium oxide.

Furthermore, the substrate 10SB may include at least one or more types selected from a group including a sintered body, BN, AlN, $Al_2O_3$, $Ga_2O_3$, diamond, carbon, and graphite. Here, the sintered body may include at least one or more types of sintered bodies selected from a group including group IV element semiconductors, group III-V compound semiconductors, and group II-VI compound semiconductors. The sintered body may also include at least one or more types of sintered bodies selected from a group including silicon carbide, gallium nitride, silicon, aluminum nitride, and gallium oxide.

The surface roughness improvement layer 16R may include a CVD film formed by a CVD method.

The surface roughness improvement layer 16R may also include a film formed by a sol-gel method or a dip method.

Further, the surface roughness improvement layer 16R may include the same type of material as the graphite substrate 10GF.

The single crystalline body 12 may include the same type of material as the surface roughness improvement layer 16R.

Here, the surface roughness improvement layer 16R may include a metal layer.

The metal layer may include at least one or more types of layers selected from a group including Al, Co, Ni, Nb, Mo, Ru, Rh, Pd, Ag, Ta, W, Re, Os, Ir, Pt, and Au.

Further, the surface roughness improvement layer 16R may include at least one or more types of amorphous material selected from a group including group IV element semiconductors, group III-V compound semiconductors, and group II-VI compound semiconductors.

The surface roughness improvement layer 16R may also include at least one or more types of amorphous material selected from a group including silicon carbide, gallium nitride, silicon, aluminum nitride, and gallium oxide.

Figure 21:
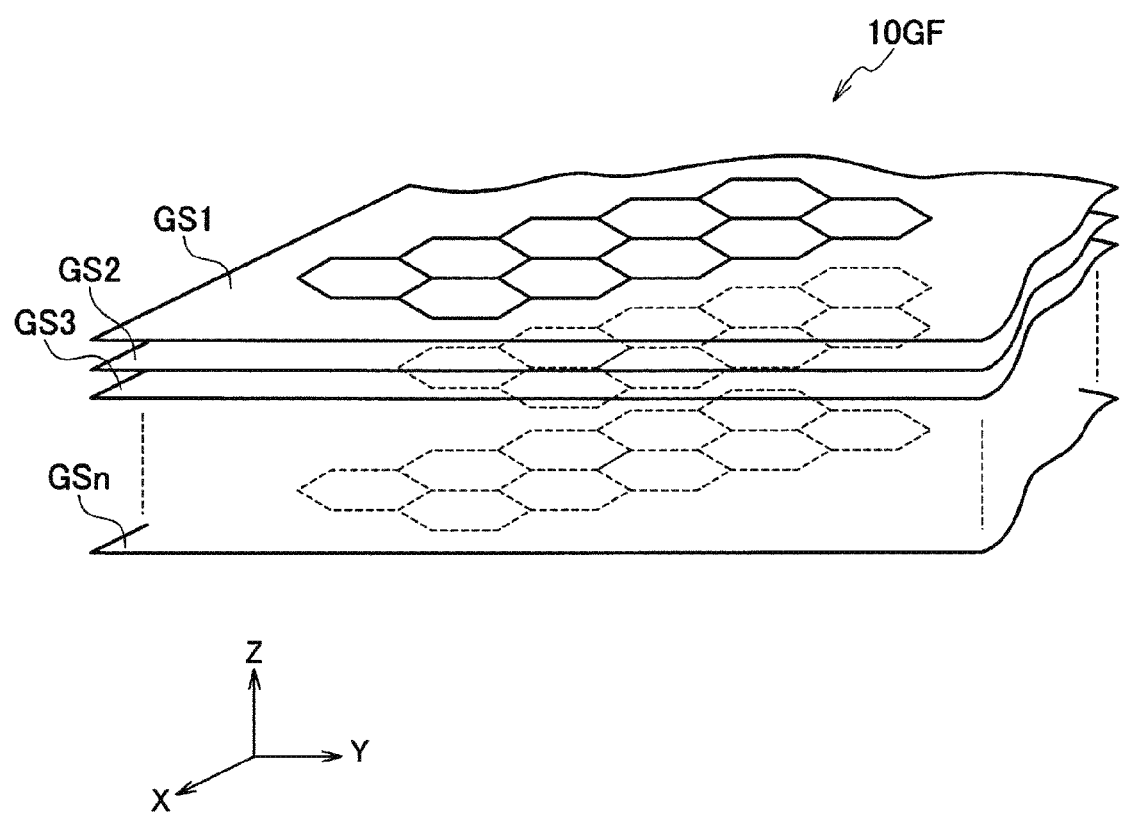
FIG. 21 is a schematic bird's-eye view of a graphite substrate applicable to the semiconductor substrate structure according to one embodiment of the present disclosure to which the present technique is applied.

The graphite substrate 10GF applicable to the semiconductor substrate structure 1 according to one embodiment of the present disclosure to which the present technique is applied has a laminated structure of graphite sheets GS1•GS2•GS3• . . . •GSn, as illustrated in FIG. 21. The graphite sheets GS1•GS2•GS3• . . . •GSn of respective planes of n layers have a plurality of hexagonal system covalent bonds in one laminated crystal structure, and the graphite sheets GS1•GS2•GS3• . . . •GSn of the respective planes are bonded by a van der Waals force.

The graphite substrate 10GF, which is made of a carbon-based anisotropic heat transfer material, is a layered crystalline body having a hexagonal network structure of carbon atoms, and also has anisotropic heat conduction, and the graphite sheets GS1•GS2•GS3• . . . •GSn illustrated in FIG. 21 have larger thermal conductivity (higher thermal conductivity) than that of the Z-axis thickness direction with respect to the crystal plane direction (on the XY plane).

Figure 22A:
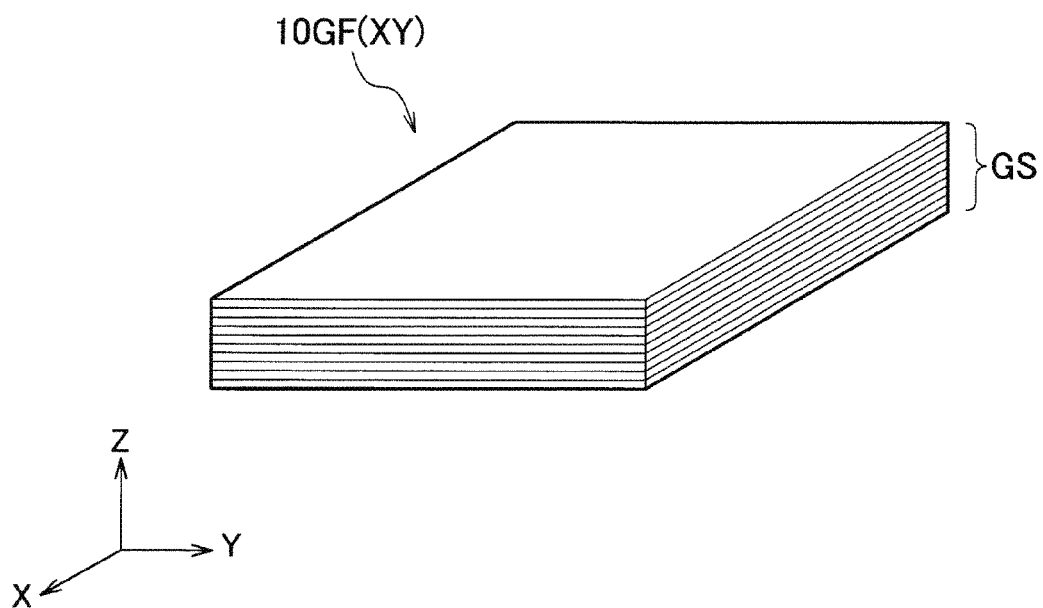
Figure 22B:
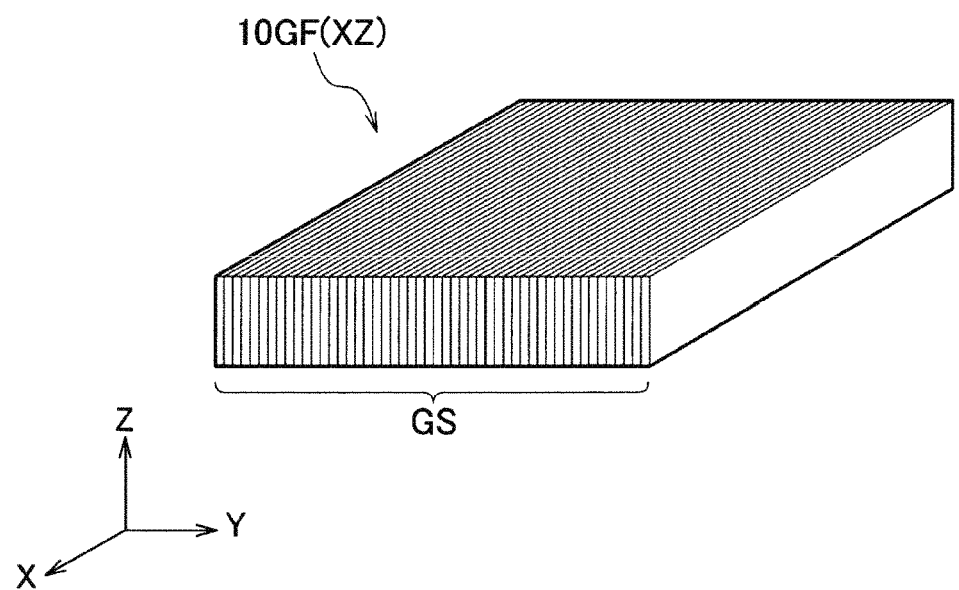

A schematic bird's-eye view of the graphite substrate 10GF (XY) of XY orientation, which is an example of the graphite substrate 10GF applicable to the semiconductor substrate structure 1 according to one embodiment of the present disclosure to which the present technique is applied, is illustrated as in FIG. 22A, and a schematic bird's-eye view of the graphite substrate 10GF (XZ) of XZ orientation is illustrated as in FIG. 22B.

In the graphite substrate 10GF, two types of graphite substrates 10GF (XY) and 10GF (XZ) having different orientations may be used.

The graphite substrate 10GF has the graphite substrate 10GF (XY) having the XY orientation (first orientation) with a higher thermal conductivity in the surface direction than in the thickness direction, and the graphite substrate 10GF (XZ) having the XZ orientation (second orientation) with a higher thermal conductivity in the thickness direction than in the surface direction. As illustrated in FIG. 22A, the graphite substrate 10GF (XY) having the XY orientation has a thermal conductivity of, for example, X=1,500 (W/mK), Y=1,500 (W/mK), and Z=5 (W/mK). On the other hand, as illustrated in FIG. 22B, the graphite substrate 10GF (XZ) having the XZ orientation has a thermal conductivity of, for example, X=1,500 (W/mK), Y=5 (W/mK), and Z=1,500 (W/mK). In addition, the graphite plates 10GF (XY) and 10GF (XZ) both have a density of 2.2 (g/cm³).

The semiconductor substrate structure 1 according to one embodiment of the present disclosure to which the present technique described above is applied may be used, for example, for manufacturing various SiC semiconductor devices. As examples of these, an SiC Schottky barrier diode (SBD), an SiC trench gate (T) type metal oxide semiconductor field effect transistor (MOSFET), and an SiC planar gate type MOSFET are illustrated below.

(SiC-SBD)

Figure 23:
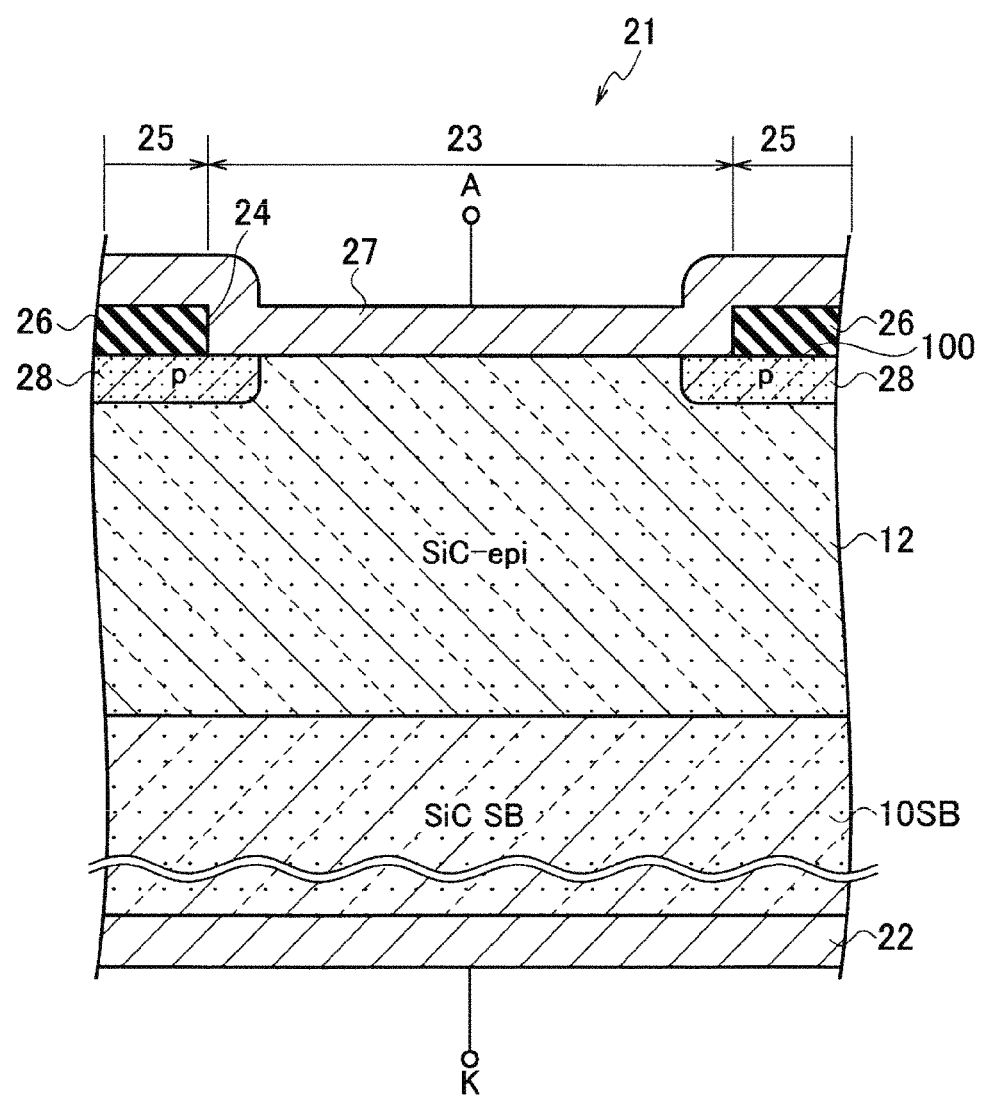
FIG. 23 is a schematic cross-sectional view of a Schottky barrier diode manufactured using the semiconductor substrate structure according to one embodiment of the present disclosure to which the present technique is applied.

An SiC-SBD 21 manufactured using the semiconductor substrate structure according to one embodiment of the present disclosure to which the present technique is applied includes the semiconductor substrate structure 1 including the SiC sintered body 10SB and the SiC epitaxial growth layer 12, as illustrated in FIG. 23. The SiC sintered body 10SB and the SiC epitaxial growth layer 12 are bonded by the room-temperature bonding or a diffusion bonding. The bonding interface layer 14 may also be interposed between the SiC sintered body 10SB and the SiC epitaxial growth layer 12.

The SiC sintered body 10SB is doped into an n⁺ type (whose impurity density is, for example, about $1 \times 10^{18}$ cm⁻³ to about $1 \times 10^{21}$ cm⁻³), and the SiC epitaxial growth layer 12 is doped into an n⁻ type (whose impurity density is, for example, about $5 \times 10^{14}$ cm⁻³ to about $5 \times 10^{16}$ cm⁻³).

The SiC epitaxial growth layer 12 may also be made of any of 4H—SiC, 6H—SiC, 2H—SiC, or 3C—SiC.

Further, any of BN, AlN, $Al_2O_3$, $Ga_2O_3$, diamond, carbon, or graphite may be included instead of the SiC sintered body 10SB.

As the n-type doping impurity, for example, nitrogen (N), phosphorus (P), arsenic (As), or the like may be applied.

As the p-type doping impurity, for example, TMA or the like may be applied.

The rear surface of the SiC sintered body 10SB has a cathode electrode 22 so as to cover its entire area, and the cathode electrode 22 is connected to a cathode terminal K.

In addition, a surface 100 (for example, (0001) Si plane) of the SiC epitaxial growth layer 12 has a contact hole 24 for exposing part of the SiC epitaxial growth layer 12 as an active region 23, and a field insulating film 26 is formed in a field region 25 surrounding the active region 23.

The field insulating film 26 is made of silicon oxide ($SiO_2$), but may be made of another insulating material such as silicon nitride (SiN). An anode electrode 27 is formed on the field insulating film 26, and the anode electrode 27 is connected to an anode terminal A.

A p-type junction termination extension (JTE) structure 28 is formed near the surface 100 (surface layer portion) of the SiC epitaxial growth layer 12 so as to be in contact with the anode electrode 27. The JTE structure 28 is formed along the contour of the contact hole 24 so as to extend over the inside and outside of the contact hole 24 of the field insulating film 26.

(SiC-TMOSFET)

Figure 24:
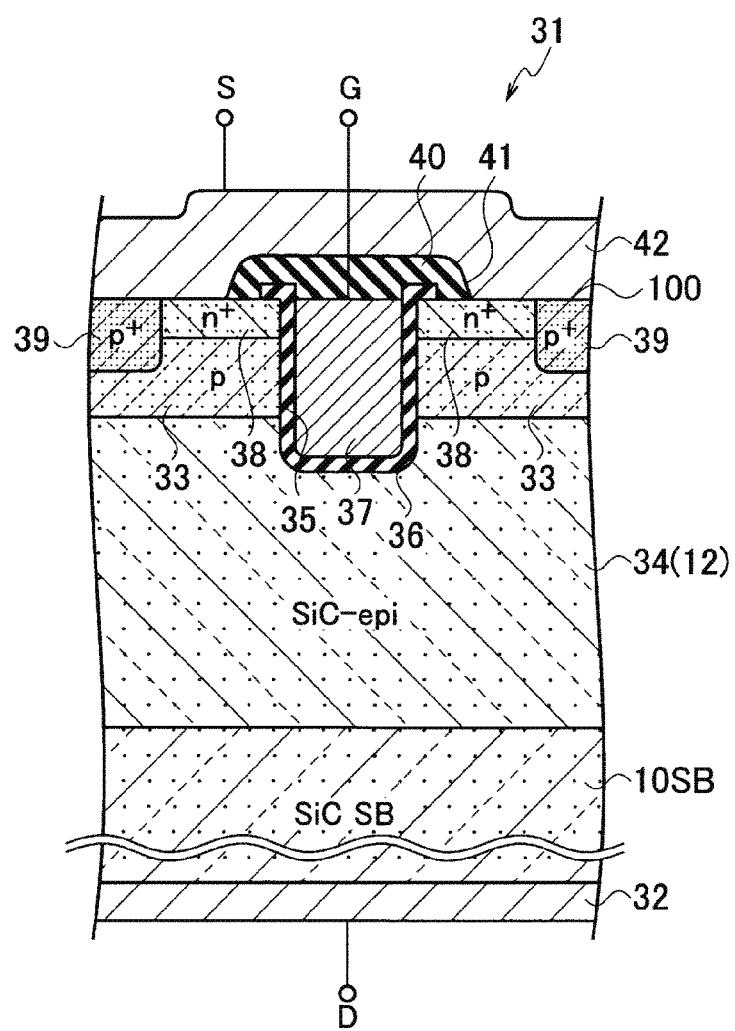
FIG. 24 is a schematic cross-sectional view of a trench gate type MOSFET manufactured using the semiconductor substrate structure according to one embodiment of the present disclosure to which the present technique is applied.

A trench gate type MOSFET 31 manufactured using the semiconductor substrate structure according to one embodiment of the present disclosure to which the present technique is applied includes the semiconductor substrate structure 1, which includes the SiC sintered body 10SB and the SiC epitaxial growth layer 12, as illustrated in FIG. 24. The SiC sintered body 10SB and the SiC epitaxial growth layer 12 are bonded by the room-temperature bonding or the diffusion bonding. The bonding interface layer 14 may also be interposed between the SiC sintered body 10SB and the SiC epitaxial growth layer 12.

The SiC sintered body 10SB is doped into an $n^+$ type (whose impurity density is, for example, about $1\times10^{18}$ $cm^{-3}$ to about $1\times10^{21}$ $cm^{-3}$), and the SiC epitaxial growth layer 12 is doped into an $n^-$ type (whose impurity density is, for example, about $5\times10^{14}$ $cm^{-3}$ to about $5\times10^{16}$ $cm^{-3}$).

Further, the SiC epitaxial growth layer 12 may be made of any of 4H—SiC, 6H—SiC, 2H—SiC, or 3C—SiC.

Further, any of BN, AlN, $Al_2O_3$, $Ga_2O_3$, diamond, carbon, or graphite may be included instead of the SiC sintered body 10SB.

As the n-type doping impurity, for example, nitrogen (N), phosphorus (P), arsenic (As), or the like may be applied.

As the p-type doping impurity, for example, TMA or the like may be applied.

A rear surface ((000-1) plane (C plane)) of the SiC sintered body 10SB has a drain electrode 32 so as to cover its entire area, in which the drain electrode 32 is connected to a drain terminal D.

A body region 33 of p type (whose impurity density of, for example, about $1\times10^{16}$ $cm^{-3}$ to about $1\times10^{19}$ $cm^{-3}$) is formed near the surface 100 ((0001) Si plane) (surface layer portion) of the SiC epitaxial growth layer 12. In the SiC epitaxial growth layer 12, a portion on the side of the SiC sintered body 10SB with respect to the body region 33 is an $n^-$ type drain region 34 (12) where the state of the SiC epitaxial growth layer is maintained at it is.

A gate trench 35 is formed in the SiC epitaxial growth layer 12. The gate trench 35 penetrates the body region 33 from the surface 100 of the SiC epitaxial growth layer 12, so that the deepest portion thereof reaches the drain region 34.

A gate insulating film 36 is formed on the inner surface of the gate trench 35 and the surface 100 of the SiC epitaxial growth layer 12 so as to cover the entire inner surface of the gate trench 35. Then, a gate electrode 37 is buried in the gate trench 35 by filling the inside of the gate insulating film 36 with, for example, polysilicon. A gate terminal G is connected to the gate electrode 37.

An $n^+$ type source region 38, which forms part of the side surface of the gate trench 35, is formed in the surface layer portion of the body region 33.

In addition, a body contact region 39 of $p^+$ type (whose impurity density is, for example, about $1\times10^{18}$ $cm^{-3}$ to about $1\times10^{21}$ $cm^{-3}$), which penetrates the source region 38 from the surface 100 of the SiC epitaxial growth layer 12 and is connected to the body region 33, is formed in the SiC epitaxial growth layer 12.

An interlayer insulating film 40 made of $SiO_2$ is formed on the SiC epitaxial growth layer 12. A source electrode 42 is connected to the source region 38 and the body contact region 39 through a contact hole 41 formed in the interlayer insulating film 40. A source terminal S is connected to the source electrode 42.

By applying a predetermined voltage (a voltage equal to or higher than a gate threshold voltage) to the gate electrode 37 while a predetermined potential difference is generated between the source electrode 42 and the drain electrode 32 (between the source and the drain), a channel can be formed near an interface with the gate insulating film 36 in the body region 33 by an electric field from the gate electrode 37. Thus, an electric current can be allowed to flow between the source electrode 42 and the drain electrode 32, and the SiC-TMOSFET 31 can be turned on.

(SiC Planar Gate Type MOSFET)

Figure 25:
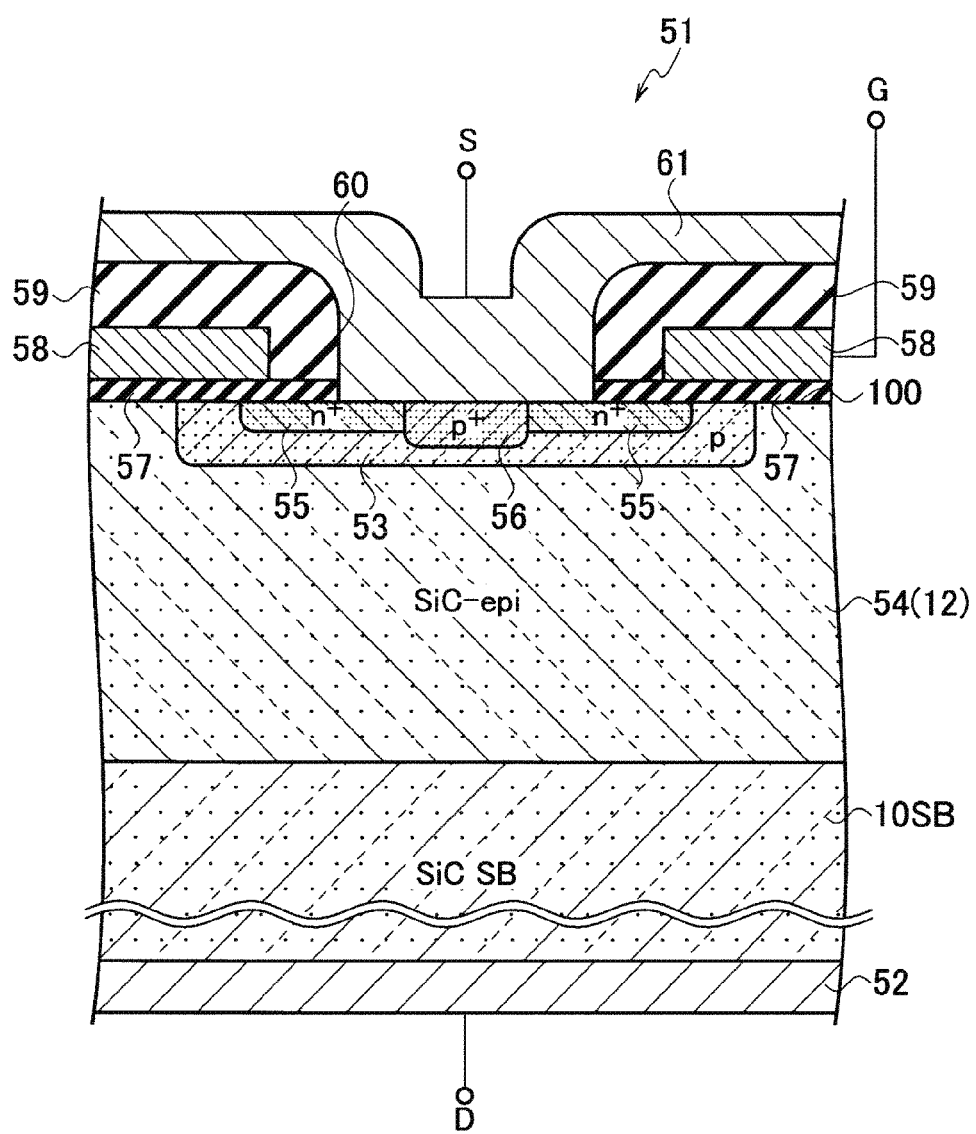
FIG. 25 is a schematic cross-sectional view of a planar gate type MOSFET manufactured using the semiconductor substrate structure according to one embodiment of the present disclosure to which the present technique is applied.

A planar gate type MOSFET 51 manufactured using the semiconductor substrate structure 1 according to one embodiment of the present disclosure to which the present technique is applied includes the semiconductor substrate structure 1, which includes the SiC sintered body 10SB and the SiC epitaxial growth layer 12, as illustrated in FIG. 25. The SiC sintered body 10SB and the SiC epitaxial growth layer 12 are bonded by the room-temperature bonding or the diffusion bonding. The bonding interface layer 14 may also be interposed between the SiC sintered body 10SB and the SiC epitaxial growth layer 12.

The SiC sintered body 10SB is doped into an $n^+$ type (whose impurity density is, for example, about $1\times10^{18}$ $cm^{-3}$ to about $1\times10^{21}$ $cm^{-3}$), and the SiC epitaxial growth layer 12 is doped into an $n^-$ type (whose impurity density is, for example, about $5\times10^{14}$ $cm^{-3}$ to about $5\times10^{16}$ $cm^{-3}$).

Furthermore, the SiC epitaxial growth layer 12 may be made of any of 4H—SiC, 6H—SiC, 2H—SiC, or 3C—SiC.

Further, any of BN, AlN, $Al_2O_3$, $Ga_2O_3$, diamond, carbon, or graphite may be included instead of the SiC sintered body 10SB.

As the n-type doping impurity, for example, nitrogen (N), phosphorus (P), arsenic (As), or the like may be applied.

As the p-type doping impurity, for example, TMA or the like may be applied.

A drain electrode 52 is formed on the rear surface ((000-1) plane (C plane)) of the SiC sintered body 10SB so as to cover its entire area, in which a drain terminal D is connected to the drain electrode 52.

A body region 53 of p type (whose impurity density is, for example, about $1\times10^{16}$ $cm^{-3}$ to about $1\times10^{19}$ $cm^{-3}$) is formed in a well shape near the surface 100 ((0001) Si plane) (surface layer portion) of the SiC epitaxial growth layer 12. In the SiC epitaxial growth layer 12, a portion on the side of the SiC substrate 2 with respect to the body region 53 is an $n^-$ type drain region 54 (12) where the state after the epitaxial growth is maintained as it is.

In the surface layer portion of the body region 53, an n⁺ type source region 55 is formed to be spaced apart from the periphery of the body region 53.

A body contact region 56 of p⁺ type (whose impurity density is for example, about $1\times10^{18}$ cm$^{-3}$ to about $1\times10^{21}$ cm$^{-3}$) is formed inside the source region 55. The body contact region 56 penetrates the source region 55 in the depth direction, and is connected to the body region 53.

A gate insulating film 57 is formed on the surface 100 of the SiC epitaxial growth layer 12. The gate insulating film 57 covers a portion of the body region 53 surrounding the source region 55 (a peripheral portion of the body region 53) and an outer peripheral edge of the source region 55.

A gate electrode 58 made of, for example, polysilicon, is formed on the gate insulating film 57. The gate electrode 58 faces the peripheral portion of the body region 53 with the gate insulating film 57 interposed therebetween. A gate terminal G is connected to the gate electrode 58.

An interlayer insulating film 59 made of SiO$_2$ is formed on the SiC epitaxial growth layer 12. A source electrode 61 is connected to the source region 55 and the body contact region 56 through the contact hole 60 formed in the interlayer insulating film 59. A source terminal S is connected to the source electrode 61.

By applying a predetermined voltage (a voltage equal to or higher than a gate threshold voltage) to the gate electrode 58 while a predetermined potential difference is generated between the source electrode 61 and the drain electrode 52 (between the source and the drain), a channel can be formed near an interface with the gate insulating film 57 in the body region 53 by an electric field from the gate electrode 58. Thus, an electric current can be allowed to flow between the source electrode 61 and the drain electrode 52, and the planar gate type MOSFET 51 can be turned on.

While the present embodiment has been described above, the present disclosure may also be implemented in other forms.

For example, although not shown, a vertical type device structure may be manufactured using the semiconductor substrate structure 1 according to one embodiment of the present disclosure to which the present technique is applied. That is, a vertical type power semiconductor device, which includes a substrate, an epitaxial growth layer bonded to the substrate by the room-temperature bonding or diffusion bonding, and a first metal electrode arranged on the substrate surface facing a bonding surface between the substrate and the epitaxial growth layer, may be formed.

Furthermore, a vertical type power semiconductor device, which further includes a second metal electrode arranged on the surface of the epitaxial growth layer facing the bonding surface between the substrate and the epitaxial growth layer, may be formed.

In addition, for example, a horizontal type device structure may also be manufactured using the semiconductor substrate structure 1 according to the embodiment of the present disclosure to which the present technique is applied. That is, a horizontal type power semiconductor device, which includes a substrate, an epitaxial growth layer bonded to the substrate by the room-temperature bonding or diffusion bonding, and a second metal electrode arranged on the surface of the epitaxial growth layer facing a bonding surface between the substrate and the epitaxial growth layer, may be formed.

Also in the aforementioned vertical type or horizontal type power semiconductor device, the epitaxial growth layer may include at least one or more types selected from a group including group IV element semiconductors, group III-V compound semiconductors, and group II-VI compound semiconductors. Further, the epitaxial growth layer may also include at least one or more types selected from a group including silicon carbide, gallium nitride, silicon, aluminum nitride, and gallium oxide.

Further, in the aforementioned vertical type or horizontal type power semiconductor device, the substrate may include at least one or more types selected from a group including a sintered body, BN, AlN, Al$_2$O$_3$, Ga$_2$O$_3$, diamond, carbon, and graphite. Further, the sintered body may include at least one or more types of sintered bodies selected from a group including group IV element semiconductors, group III-V compound semiconductors, and group II-VI compound semiconductors. The sintered body may also include at least one or more types of sintered bodies selected from a group including silicon carbide, gallium nitride, silicon, aluminum nitride, and gallium oxide.

For example, although not shown, a MOS capacitor may also be manufactured using the semiconductor substrate structure 1 according to one embodiment of the present disclosure to which the present technique is applied. In the MOS capacitor, the yield and reliability can be improved.

Moreover, although not shown, a bipolar transistor may also be manufactured using the semiconductor substrate structure 1 according to an embodiment of the present disclosure to which this technique is applied. In addition, the semiconductor substrate structure 1 according to the embodiment may also be used for manufacturing an SiC-pn diode, an SiC insulated gate bipolar transistor (IGBT), an SiC complementary MOSFET, and the like.

Figure 26A:
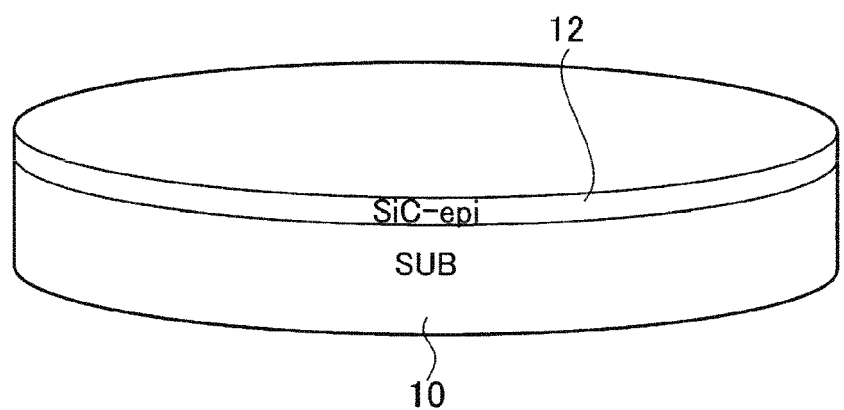
FIG. 26A is a schematic bird's-eye view of the semiconductor substrate structure (wafer) according to one embodiment of the present disclosure to which the present technique is applied.

A schematic bird's-eye view of the semiconductor substrate structure (wafer) 1 according to one embodiment of the present disclosure to which the present technique is applied includes the substrate 10 and the epitaxial growth layer 12 bonded to the substrate 10, as illustrated in FIG. 26A, where the substrate 10 and the epitaxial growth layer are bonded by the room-temperature bonding. Here, the room-temperature bonding includes at least one or more types selected from a surface activation bonding, a plasma activation bonding, and an atomic diffusion bonding.

The substrate 10 and the epitaxial growth layer 12 may also be bonded by the diffusion bonding.

When the room-temperature bonding is used, the surface roughness Ra of the substrate surface is set to about 1 nm or less. As a result, the thickness of the bonding interface layer (AIL) 14 having a different composition is set to about 1 nm to 10 μm.

When the diffusion bonding is used, the surface roughness of the substrate surface may be coarse depending on a material and a bonding temperature. The thickness of the bonding interface layer (AIL) 14 having a different composition gradient by atomic diffusion is approximately 1 nm to 10 μm in order to use the atomic diffusion.

The epitaxial growth layer 12 may include at least one or more types selected from a group including group IV element semiconductors, group III-V compound semiconductors, and group II-VI compound semiconductors.

The epitaxial growth layer 12 may include at least one or more types selected from a group including silicon carbide, gallium nitride, silicon, aluminum nitride, and gallium oxide.

Further, the SiC epitaxial growth layer may be made of any of 4H—SiC, 6H—SiC, 2H—SiC, or 3C—SiC.

The substrate 10 may include at least one or more types selected from a group including a sintered body, BN, AN, Al$_2$O$_3$, Ga$_2$O$_3$, diamond, carbon, and graphite.

Here, the sintered body may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

The SiC epitaxial growth layer 12 may be made of, for example, 4H—SiC, and may have an OFF angle of less than 4 degrees.

The thickness of the substrate (SiC sintered body) 10 is, for example, about 200 μm to about 500 μm, and the thickness of the SiC epitaxial growth layer 12 is, for example, about 4 μm to about 100 μm.

Figure 26B:
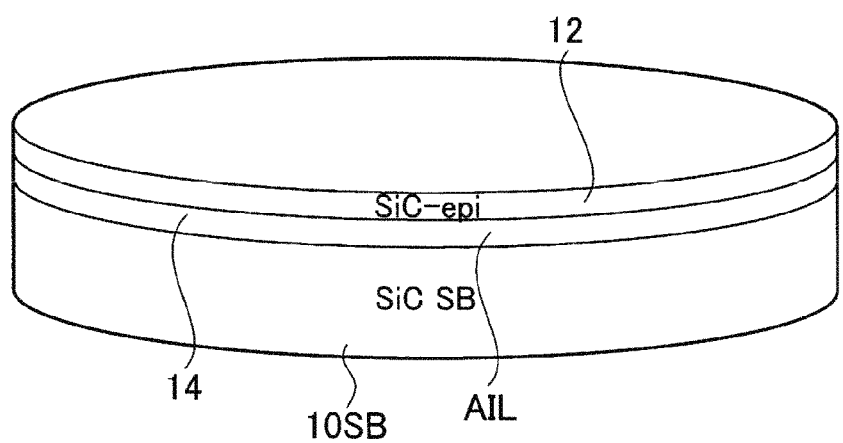
FIG. 26B is a schematic bird's-eye view of the semiconductor substrate structure (wafer) according to one embodiment of the present disclosure to which the present technique is applied (an example including a bonding interface layer).

A schematic bird's-eye view (an example including the bonding interface layer) of the semiconductor substrate structure (wafer) 1 according to one embodiment of the present disclosure to which the present technique is applied includes the substrate 10 and the epitaxial growth layer 12 bonded to the substrate 10, as illustrated in FIG. 26B, in which the substrate and the epitaxial growth layer are bonded via the bonding interface layer 14.

Here, the bonding interface layer 14 may include a metal layer.

Here, the metal layer may include at least one or more types selected from a group including Al, Co, Ni, Nb, Mo, Ru, Rh, Pd, Ag, Ta, W, Re, Os, Ir, Pt, and Au.

The bonding interface layer 14 may include at least one or more types of amorphous material selected from a group including group IV element semiconductors, group III-V compound semiconductors, and group II-VI compound semiconductors.

Further, the bonding interface layer may also include at least one or more types of amorphous material selected from a group including silicon carbide, gallium nitride, silicon, aluminum nitride, and gallium oxide.

(SiC Epitaxial Wafer)

The SiC epitaxial growth layer 12 may be made of, for example, 4H—SiC, and may have an OFF angle of less than 4 degrees. The thickness of the substrate (SiC sintered body) 10 is, for example, about 200 μm to about 500 μm, and the thickness of the SiC epitaxial growth layer 12 is, for example, about 4 μm to about 100 μm.

(SiC-SBD)

Figure 27:
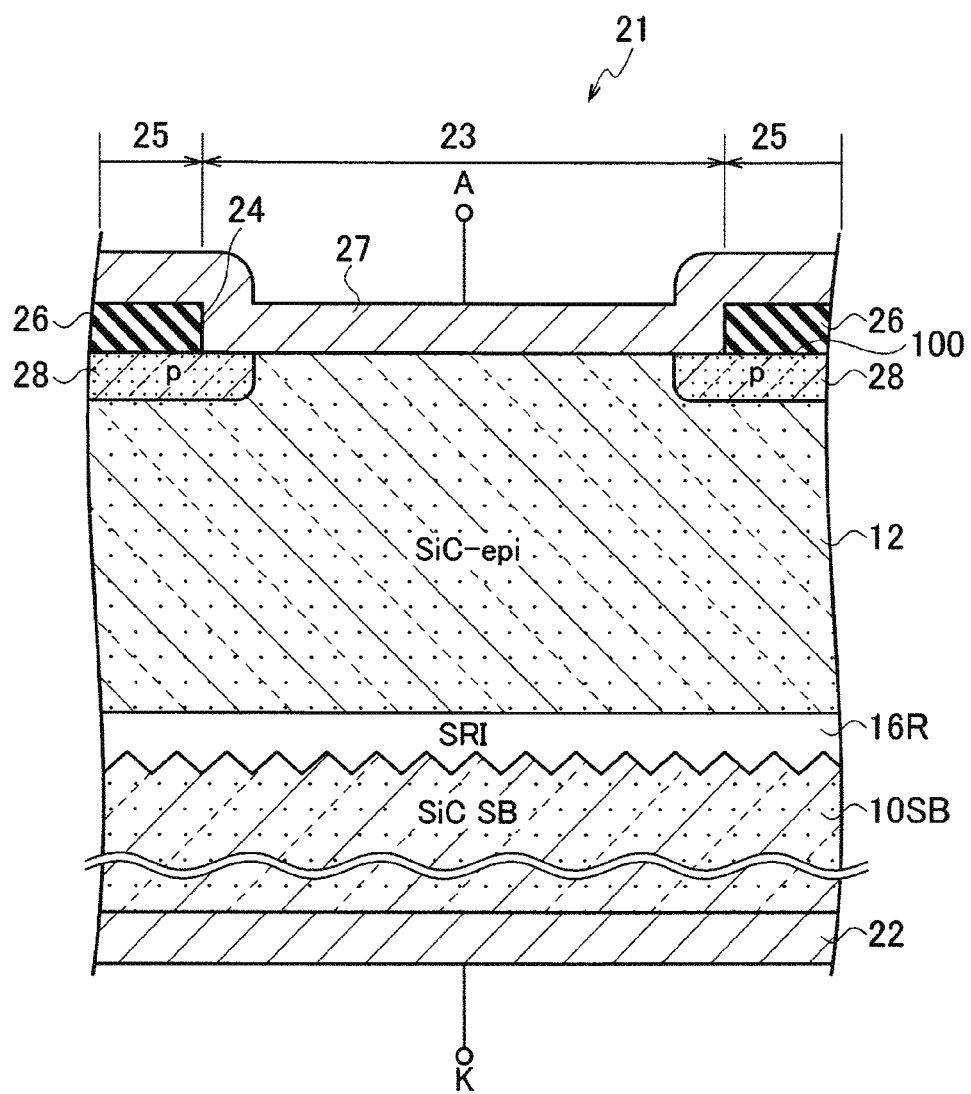
FIG. 27 is a schematic cross-sectional view of a Schottky barrier diode manufactured using the semiconductor substrate structure according to one embodiment of the present disclosure to which the present technique is applied.

Furthermore, an SiC-SBD 21 manufactured using the semiconductor substrate structure according to another embodiment of the present disclosure to which the present technique is applied includes the semiconductor structure 1, which includes the SiC sintered body 10SB and the SiC epitaxial growth layer 12, as illustrated in FIG. 27. The surface roughness improvement layer 16R is included between the SiC sintered body 10SB and the SiC epitaxial growth layer 12. In this example, the descriptions of the same technical features and configurations will be omitted in comparison to FIG. 23, and only different technical features and configurations or newly added technical features and configurations will be described below.

(SiC-TMOSFET)

Figure 28:
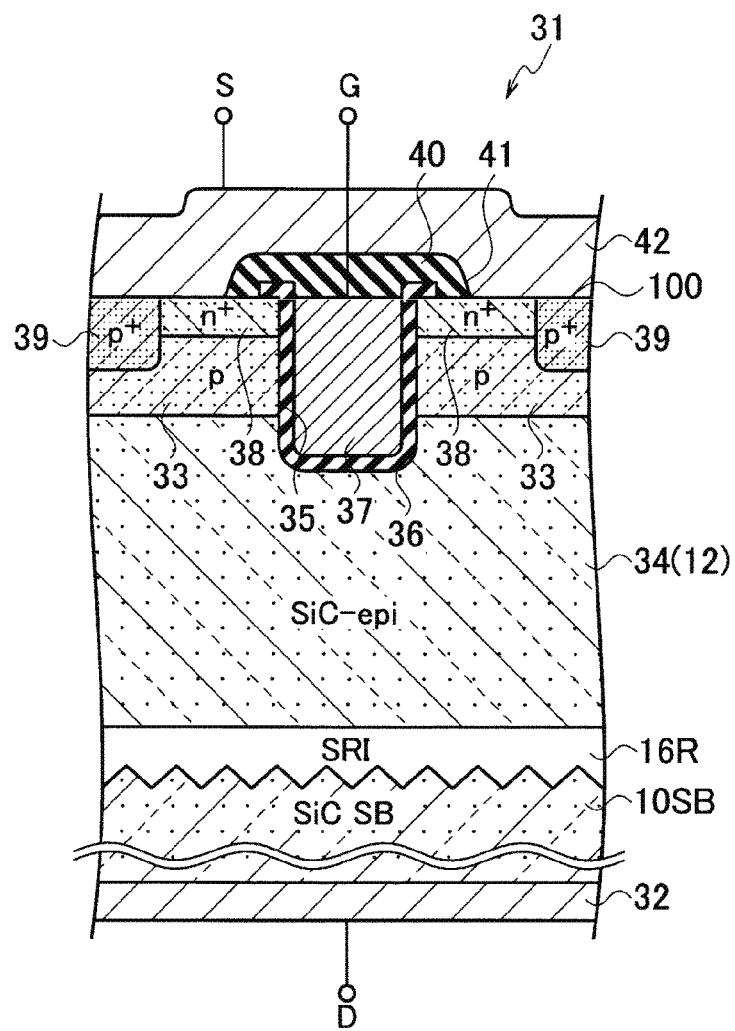
FIG. 28 is a schematic cross-sectional view of a trench gate type MOSFET manufactured using the semiconductor substrate structure according to one embodiment of the present disclosure to which the present technique is applied.

The trench gate type MOSFET 31 manufactured using the semiconductor substrate structure according to one embodiment of the present disclosure to which the present technique is applied includes the semiconductor substrate structure 1, which includes the SiC sintered body 10SB and the SiC epitaxial growth layer 12, as illustrated in FIG. 28. The surface roughness improvement layer 16R is included between the SiC sintered body 10SB and the SiC epitaxial growth layer 12. Hereinafter, in the present embodiment, the descriptions of the same technical features and configurations will be omitted and only different technical features and configurations or newly added technical features and configurations, as compared with FIG. 24, will be described below.

(SiC Planar Gate Type MOSFET)

Figure 29:
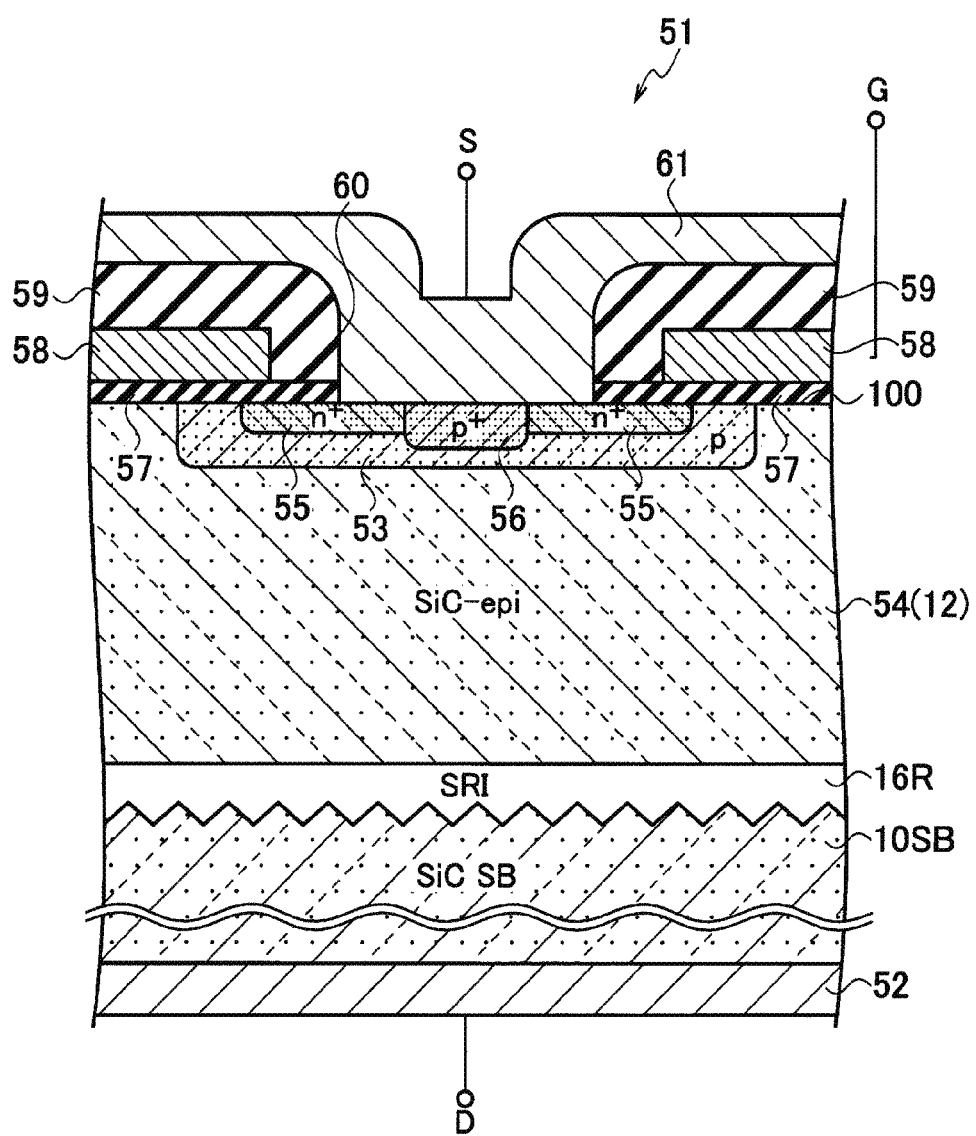
FIG. 29 is a schematic cross-sectional view of a planar gate type MOSFET manufactured using the semiconductor substrate structure according to one embodiment of the present disclosure to which the present technique is applied.

The planar gate type MOSFET 51 manufactured using the semiconductor substrate structure 1 according to one embodiment of the present disclosure to which the present technique is applied includes the semiconductor substrate structure 1, which includes the SiC sintered body 10SB and the SiC epitaxial growth layer 12, as illustrated in FIG. 29. The surface roughness improvement layer 16R is included between the SiC sintered body 10SB and the SiC epitaxial growth layer 12. Hereinafter, in the present embodiment, the description of the same technical features and configurations will be omitted and only different technical features and configurations, or newly added technical features and configurations, as compared with FIG. 25, will be described below.

While the present embodiment has been described above, the present disclosure may be implemented in other forms.

For example, although now shown, a vertical type device structure may also be manufactured using the semiconductor substrate structure 1 according to one embodiment of the present disclosure to which the present technique is applied. That is, it includes a substrate, a surface roughness improvement layer arranged on the substrate, a single crystalline body bonded to the substrate via the surface roughness improvement layer by the room-temperature bonding or diffusion bonding, and a first metal electrode arranged on the surface of the substrate facing a bonding surface between the substrate and the single crystalline body. A vertical type power semiconductor device may also be formed.

Further, a vertical type power semiconductor device, which further includes a second metal electrode arranged on the surface of the single crystalline body facing the bonding surface between the substrate and the single crystalline body, may be formed.

In addition, for example, a horizontal type device structure may be manufactured using the semiconductor substrate structure 1 according to the embodiment of the present disclosure to which the present technique is applied. That is, a horizontal type power semiconductor device structure, which includes a substrate, a surface roughness improvement layer arranged on the substrate, a single crystalline body bonded to the substrate via the surface roughness improvement layer by the room-temperature bonding or diffusion bonding, and a second metal electrode arranged on the surface of the single crystalline body facing a bonding surface between the substrate and the single crystalline body, may be formed.

Further, in the aforementioned vertical type or horizontal type power semiconductor device, the single crystalline body may include at least one or more types selected from a group including group IV element semiconductors, group III-V compound semiconductors, and group II-VI compound semiconductors. Further, the single crystalline may include at least one or more types selected from a group including silicon carbide, gallium nitride, silicon, aluminum nitride, and gallium oxide.

Further, in the aforementioned vertical or horizontal type power semiconductor device, the substrate may include at least one or more types selected from a group including a sintered body, BN, AlN, $Al_2O_3$, $Ga_2O_3$, diamond, carbon, and graphite. Further, the sintered body may include at least one or more types of sintered bodies selected from a group including group IV element semiconductors, group III-V compound semiconductors, and group II-VI compound semiconductors. Further, the sintered body may include at least one or more types of sintered bodies selected from a group including silicon carbide, gallium nitride, silicon, aluminum nitride, and gallium oxide.

For example, although not shown, a MOS capacitor may also be manufactured using the semiconductor substrate structure 1 according to one embodiment of the present disclosure to which the present technique is applied. In the MOS capacitor, the yield and reliability can be improved.

Moreover, although not shown, a bipolar transistor may also be manufactured using the semiconductor substrate structure 1 according to one embodiment of the present disclosure to which this technique is applied. In addition, the semiconductor substrate structure 1 according to one embodiment of the present disclosure may also be used for manufacturing an SiC-pn diode, an SiC insulated gate bipolar transistor (IGBT), an SiC complementary MOSFET, and the like.

Figure 30A:
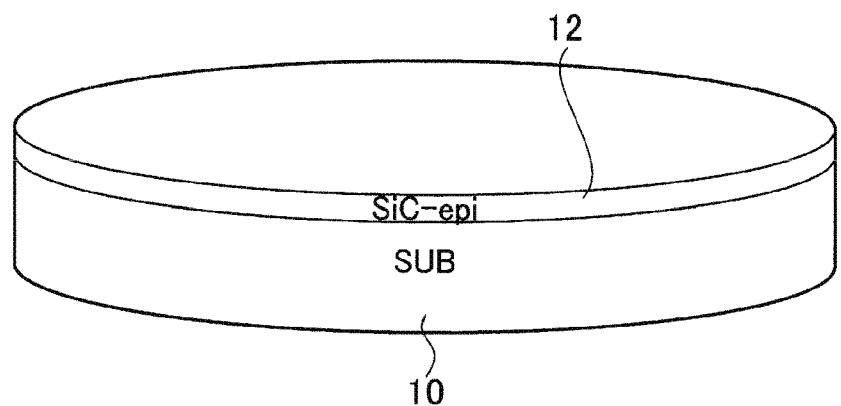
FIG. 30A is a schematic bird's-eye view of a semiconductor substrate structure (wafer) according to a comparative example.

A schematic bird's-eye view of a semiconductor substrate structure (wafer) according to a comparative example includes the substrate 10 and the epitaxial growth layer 12 bonded to the substrate 10, as illustrated in FIG. 30A.

Figure 30B:
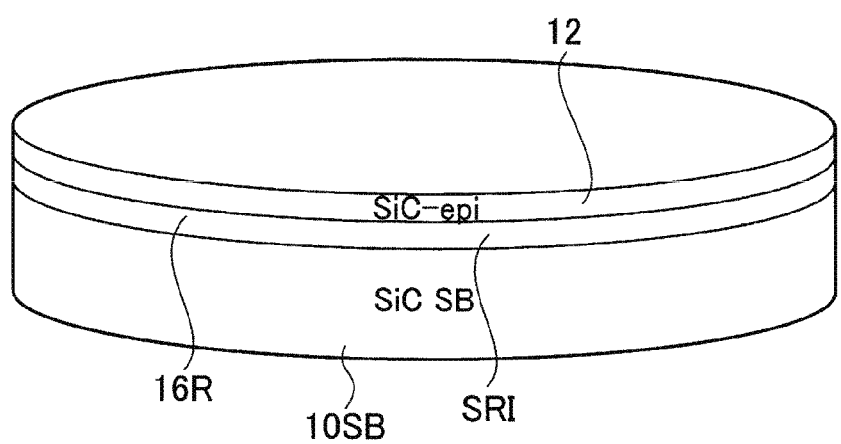
FIG. 30B is a schematic bird's-eye view of the semiconductor substrate structure (wafer) according to one embodiment of the present disclosure to which the present technique is applied.

A schematic bird's-eye view of the semiconductor substrate structure (wafer) according to one embodiment of the present disclosure to which the present technique is applied includes the substrate 10, the surface roughness improvement layer 16R arranged on the substrate 10, and the epitaxial growth layer 12 bonded to the substrate 10 via the substrate 10 by the room-temperature bonding and the surface roughness improvement layer 16R, as illustrated in FIG. 30B. Here, the room-temperature bonding includes at least one or more types selected from a surface activation bonding, a plasma activation bonding, and an atomic diffusion bonding.

Further, the substrate 10 and the epitaxial growth layer 12 may also be bonded by the diffusion bonding.

When the room-temperature bonding is used, the surface roughness Ra of the substrate surface is set to about 1 nm or less. As a result, the thickness of the surface roughness improvement layer 16R having a different composition is set to about 1 nm to 10 μm.

When the diffusion bonding is used, the surface roughness may be coarse depending on a material and a bonding temperature. The thickness of the surface roughness improvement layer 16R is approximately 1 nm to 10 μm.

The epitaxial growth layer 12 may include at least one or more types selected from a group including group IV element semiconductors, group III-V compound semiconductors, and group II-VI compound semiconductors.

The epitaxial growth layer 12 may include at least one or more types selected from a group including silicon carbide, gallium nitride, silicon, aluminum nitride, and gallium oxide.

The SiC epitaxial growth layer may also be made of any of 4H—SiC, 6H—SiC, 2H—SiC, or 3C—SiC.

The substrate 10 may include at least one or more types selected from a group including a sintered body, BN, AlN, $Al_2O_3$, $Ga_2O_3$, diamond, carbon, and graphite.

Here, the sintered body may include at least one or more types of sintered bodies selected from a group including group IV element semiconductors, group III-V compound semiconductors, and group II-VI compound semiconductors.

Further, the sintered body may also include at least one or more types of sintered bodies selected from a group including silicon carbide, gallium nitride, silicon, aluminum nitride, and gallium oxide.

The surface roughness improvement layer 16R may include a CVD film formed by a CVD method.

The surface roughness improvement layer 16R may include a film formed by a sol-gel method or a dip method.

Further, the surface roughness improvement layer 16R may include the same type of material as the substrate 10SB.

The SiC epitaxial growth layer 12 may include the same type of material as the surface roughness improvement layer 16R.

Here, the surface roughness improvement layer 16R may include a metal layer.

The metal layer may include at least one or more types selected from a group including Al, Co, Ni, Nb, Mo, Ru, Rh, Pd, Ag, Ta, W, Re, Os, Ir, Pt, and Au.

Further, the surface roughness improvement layer 16R may include at least one or more types of amorphous material selected from a group including group IV element semiconductors, group III-V compound semiconductors, and group II-VI compound semiconductors.

Further, the surface roughness improvement layer 16R may also include at least one or more types of amorphous material selected from a group including silicon carbide, gallium nitride, silicon, aluminum nitride, and gallium oxide.

The SiC epitaxial growth layer 12 may be made of, for example, 4H—SiC, and may have an OFF angle of less than 4 degrees.

The thickness of the substrate (SiC sintered body) 10 is, for example, about 200 μm to about 500 μm, and the thickness of the SiC epitaxial growth layer 12 is, for example, about 4 μm to about 100 μm.

(Example of Crystal Structure)

Figure 31A:
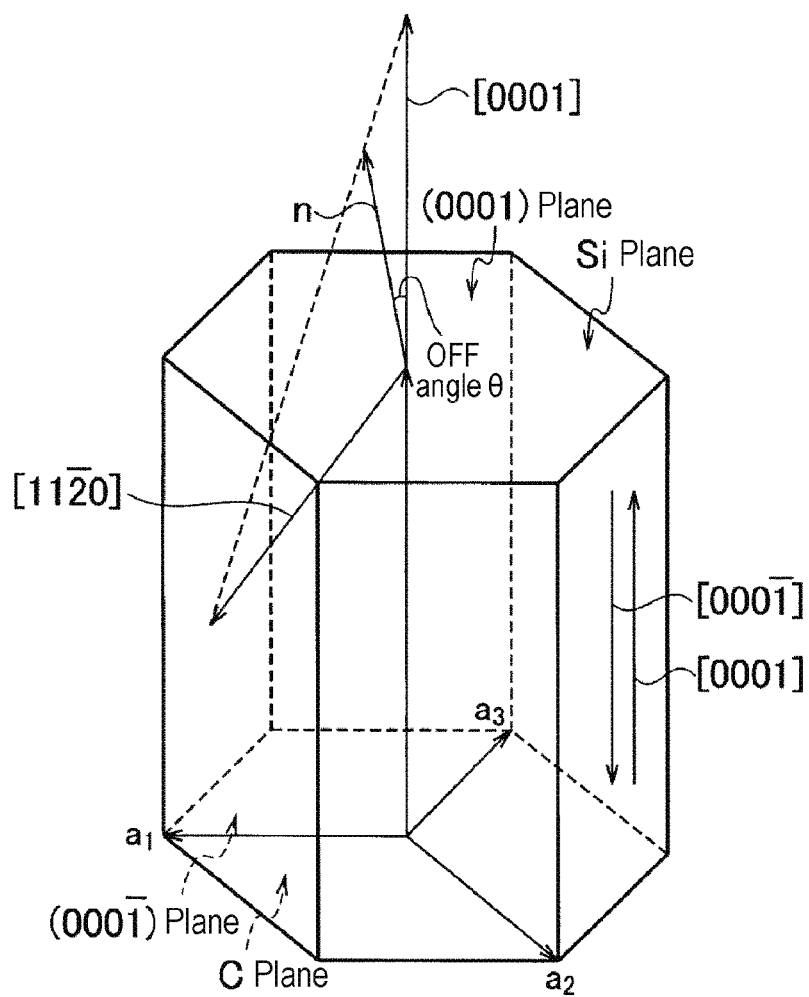
FIG. 31A is a schematic bird's-eye view of a unit cell of 4H—SiC crystal applicable to the SiC epitaxial substrate of the semiconductor substrate structure according to one embodiment of the present disclosure to which the present technique is applied.
Figure 31B:
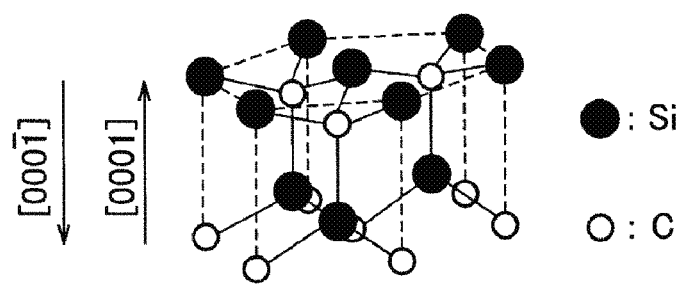
FIG. 31B is a schematic configuration view of a two-layer part of the 4H—SiC crystal.
Figure 31C:
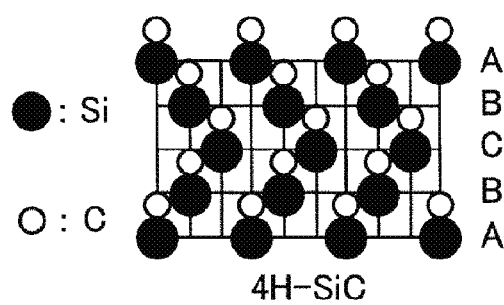
FIG. 31C is a schematic configuration view of a four-layer part of the 4H—SiC crystal.

A schematic bird's-eye view of a unit cell of 4H—SiC crystal applicable to the SiC epitaxial growth layer 12 is illustrated as in FIG. 31A, a schematic configuration of a two-layer part of the 4H—SiC crystal is illustrated as in FIG. 31B, and a schematic configuration of a four-layer part of the 4H—SiC crystal is illustrated as in FIG. 31C.

Figure 32:
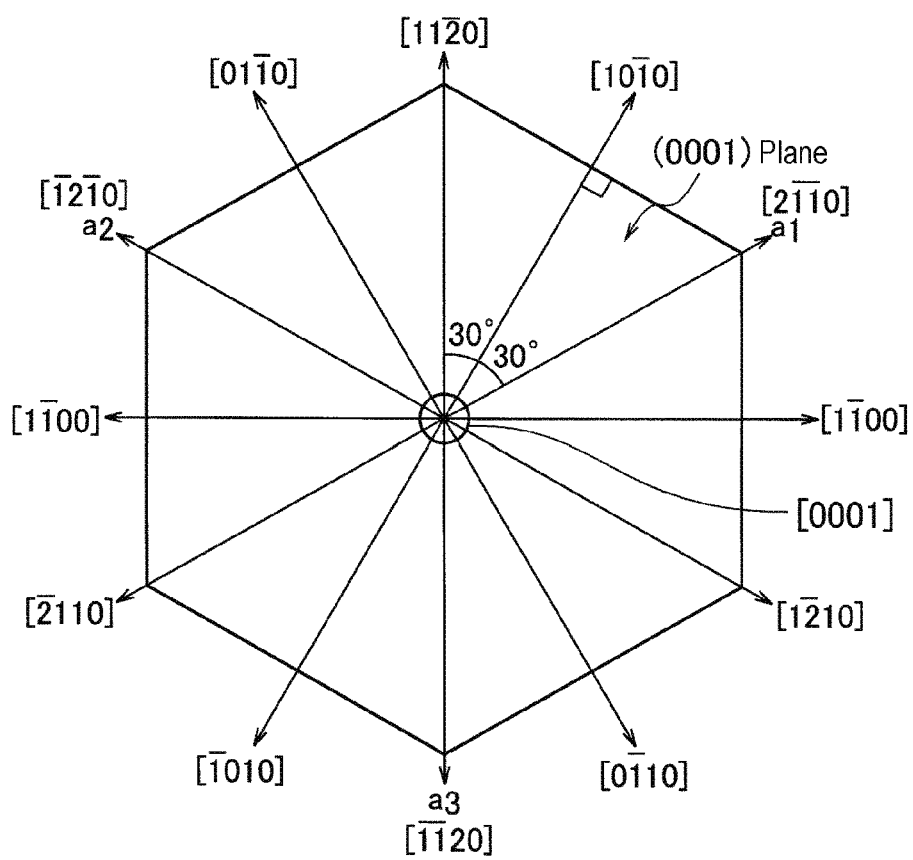
FIG. 32 is a schematic configuration view of a unit cell of the 4H—SiC crystal illustrated in FIG. 31A as viewed from directly above (0001) plane.

Further, a schematic configuration of the unit cell of the 4H—SiC crystal structure illustrated in FIG. 31A as viewed from directly above (0001) plane is illustrated as in FIG. 32.

As illustrated in FIGS. 31A to 31C, the crystal structure of 4H—SiC can be approximated by a hexagonal system, and four C atoms are bonded to one Si atom. The four C atoms are located at four apexes of a regular tetrahedron where a Si atom is arranged at its center. In these four C atoms, one C atom is located in a [0001] axis direction with respect to the Si atom, and the other three C atoms are located on the side of a [000-1] axis with respect to the Si atom. In FIG. 31A, the OFF angle θ is, for example, about 4 degrees or less.

The [0001] axis and the [000-1] axis are along the axial direction of a hexagonal prism, and the plane (top surface of the hexagonal prism) having the [0001] axis as a normal line is the (0001) plane (Si plane). On the other hand, the plane (lower surface of the hexagonal prism) having the [000-1] axis as a normal line is the (000-1) plane (C plane).

In addition, the directions perpendicular to the [0001] axis and passing through non-adjacent apexes of the hexagonal prism as viewed from directly above the (0001) plane are respectively an a1 axis [2-1-10], an a2 axis [-12-10], and an a3 axis [-1-120].

As illustrated in FIG. 32, the direction passing through the apex between the a1 axis and the a2 axis is a [11-20] axis, the direction passing through the apex between the a2 axis and the a3 axis is a [-2110] axis, and the direction passing through the apex between the a3 axis and the a1 axis is a [1-210] axis.

The axes, which are inclined at an angle of 30° with respect to the respective axes on both sides thereof between the respective six axes passing through the respective apexes of the hexagonal prism and are normal to the respective side surfaces of the hexagonal prism, are sequentially a [10-10] axis, a [1-100] axis, a [0-110] axis, a [-1010] axis, a [-1100] axis, and a [01-10] axis in a clockwise direction from between the a1 axis and the [11-20] axis, respectively. The respective planes normal to these axes (side surfaces of the hexagonal prism) are crystal planes perpendicular to the (0001) plane and the (000-1) plane.

The power semiconductor device including the semiconductor substrate structure according to the present embodiment may include any of SiC-based, Si-based, GaN-based, AlN-based, gallium-oxide-based IGBTs, diodes, MOSFETs, and thyristors.

The power semiconductor device including the semiconductor substrate structure according to the present embodiment may include a configuration of any of one-in-one module, two-in-one module, four-in-one module, six-in-one module, seven-in-one module, eight-in-one module, twelve-in-one module, or fourteen-in-one module.

According to the present embodiment, it is possible to provide a semiconductor substrate structure having a stable interface structure even at a high temperature, and a power semiconductor device including the semiconductor substrate structure.

According to the present embodiment, it is possible to provide a semiconductor substrate structure capable of eliminating restriction on materials, achieving cost reduction, and acquiring desired physical properties, and a power semiconductor device including the semiconductor substrate structure.

According to the semiconductor substrate structure of the present embodiment, it is possible to expand the range of a combination of an epitaxial growth layer and a substrate in order to bond an arbitrary substrate and an SiC epitaxial growth layer using the room-temperature bonding technique or the diffusion bonding technique, instead of forming an SiC epitaxial growth layer on an SiC single crystalline substrate.

According to the semiconductor substrate structure of the present embodiment, it is possible to use, for example, a low cost SiC polycrystalline substrate or a carbon substrate, instead of a high cost SiC single crystalline substrate, as a substrate material.

Further, according to the semiconductor substrate structure of the present embodiment, since the combination of the substrate and the SiC epitaxial growth layer having desired characteristics is possible, it is possible to improve the characteristics of the power semiconductor device. Specifically, since the thermal expansion coefficient, the thermal conductivity, the electrical conductivity, and the mechanical characteristics can be combined as desired, it is possible to improve the switching characteristics, heat resistance, and mechanical reliability of the power semiconductor device.

Further, according to the semiconductor substrate structure and the power semiconductor device including the semiconductor substrate structure of the present embodiment, an arbitrary substrate and a completed SiC epitaxial growth layer are bonded to each other using the room-temperature bonding technique or a diffusion bonding technique, whereby it is possible to shorten a process period. In addition, since the arbitrary substrate and the completed SiC epitaxial growth layer can be combined, it is possible to improve the manufacturing yield.

Preferred Embodiments of the Present Disclosure

Hereinafter, preferred embodiments of the present disclosure are described
(Supplementary Note 1)
According to an embodiment of the present disclosure, there is provided a semiconductor substrate structure, including: a substrate; and an epitaxial growth layer bonded to the substrate, wherein the substrate and the epitaxial growth layer are bonded by a room-temperature bonding or a diffusion bonding.
(Supplementary Note 2)
The structure of Supplementary note 1, wherein the epitaxial growth layer includes at least one or more selected from a group including group IV element semiconductors, group III-V compound semiconductors, and group II-VI compound semiconductors.
(Supplementary Note 3)
The structure of Supplementary note 1, wherein the epitaxial growth layer includes at least one or more selected from a group including silicon carbide, gallium nitride, silicon, aluminum nitride, and gallium oxide.
(Supplementary Note 4)
The structure of Supplementary note 1, wherein the substrate includes at least one or more selected from a group including a sintered body, BN, AlN, $Al_2O_3$, $Ga_2O_3$, diamond, carbon, and graphite.
(Supplementary Note 5)
The structure of Supplementary note 4, wherein the sintered body includes at least one or more types of sintered bodies selected from a group including group IV element semiconductors, group III-V compound semiconductors, and group II-VI compound semiconductors.
(Supplementary Note 6)
The structure of Supplementary note 4, wherein the sintered body includes at least one or more types of sintered bodies selected from a group including silicon carbide, gallium nitride, silicon, aluminum nitride, and gallium oxide.
(Supplementary Note 7)
The structure of Supplementary note 1, wherein the substrate includes a sintered body, and the substrate and the epitaxial growth layer are bonded via a bonding interface layer.
(Supplementary Note 8)
The structure of Supplementary note 7, wherein the sintered body includes at least one or more types of sintered bodies selected from a group including group IV element semiconductors, group III-V compound semiconductors, and group II-VI compound semiconductors.
(Supplementary Note 9)
The structure of Supplementary note 7, wherein the sintered body includes at least one or more types of sintered bodies selected from a group including silicon carbide, gallium nitride, silicon, aluminum nitride, and gallium oxide.
(Supplementary Note 10)
The structure of Supplementary note 7, wherein the bonding interface layer includes a metal layer.

(Supplementary Note 11)

The structure of Supplementary note 10, wherein the metal layer includes at least one or more types selected from a group including Al, Co, Ni, Nb, Mo, Ru, Rh, Pd, Ag, Ta, W, Re, Os, Ir, Pt, and Au.

(Supplementary Note 12)

The structure of Supplementary note 7, wherein the bonding interface layer includes at least one or more types of amorphous material selected from a group including group IV element semiconductors, group III-V compound semiconductors, and group II-VI compound semiconductors.

(Supplementary Note 13)

The structure of Supplementary note 7, wherein the bonding interface layer includes at least one or more types of amorphous material selected from a group including silicon carbide, gallium nitride, silicon, aluminum nitride, and gallium oxide.

(Supplementary Note 14)

According to another embodiment of the present disclosure, there is provided a power semiconductor device, including: the semiconductor substrate structure of Supplementary note 1; and at least one or more selected from a group including SiC Schottky barrier diodes, SiC-MOSFETs, SiC bipolar transistors, SiC diodes, SiC thyristors, and SiC insulated gate bipolar transistors.

(Supplementary Note 15)

According to another embodiment of the present disclosure, there is provided a power semiconductor device, including: a substrate; an epitaxial growth layer bonded to the substrate by a room-temperature bonding or a diffusion bonding; and a first metal electrode arranged on a surface of the substrate facing a bonding surface between the substrate and the epitaxial growth layer.

(Supplementary Note 16)

The device of Supplementary note 15, further comprising a second metal electrode arranged on a surface of the epitaxial growth layer facing the bonding surface between the substrate and the epitaxial growth layer.

(Supplementary Note 17)

According to another embodiment of the present disclosure, there is provided a power semiconductor device, including: the semiconductor substrate structure of claim 1; and a second metal electrode arranged on a surface of the epitaxial growth layer facing a bonding surface between the substrate and the epitaxial growth layer.

OTHER EMBODIMENTS

While some embodiments have been described above, it should be understood that the statements and drawings that form parts of the present disclosure are illustrative and not restrictive. Various alternative embodiments, examples, and operation techniques will be apparent to those skilled in the art from the disclosure.

Thus, the present embodiment includes various embodiments and the like that are not described herein.

The semiconductor substrate structure and the power semiconductor device including the semiconductor substrate structure of the present embodiment can be used for various semiconductor module techniques such as IGBT modules, diode modules, MOS modules (Si, SiC, GaN, AlN, and gallium oxide), and the like, and can be applied to a wide range of application fields such as power modules for inverter circuits that drive electric motors used as power sources for electric vehicles (including hybrid vehicles), trains, industrial robots and the like or power modules for inverter circuits that convert electric power generated by other power generators (particularly, private power generators) such as solar cells and wind power generators into electric power of a commercial power source.

According to the present disclosure in some embodiments, it is possible to provide a semiconductor substrate structure capable of eliminating restrictions on materials, achieving cost reduction, and acquiring desired physical properties, and a power semiconductor device including the semiconductor substrate structure.

In addition, it is possible to provide a semiconductor substrate structure having a stable bonding strength and high reliability even under a high temperature environment, and a power semiconductor device including the semiconductor substrate structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor substrate structure, comprising:
a substrate; and
an epitaxial growth layer bonded to the substrate,
wherein the substrate and the epitaxial growth layer are bonded by a room-temperature bonding or a diffusion bonding,
wherein the substrate and the epitaxial growth layer are bonded via a bonding interface layer, and
wherein the bonding interface layer includes at least one type of amorphous material selected from a group consisting of silicon carbide, gallium nitride, silicon, aluminum nitride, and gallium oxide.

2. The structure of claim 1, wherein the epitaxial growth layer includes at least one or more selected from a group including group IV element semiconductors, group III-V compound semiconductors, and group II-VI compound semiconductors.

3. The structure of claim 1, wherein the epitaxial growth layer includes at least one or more selected from a group including silicon carbide, gallium nitride, silicon, aluminum nitride, and gallium oxide.

4. The structure of claim 1, wherein the substrate includes at least one or more selected from a group including a sintered body, BN, AlN, $Al_2O_3$, $Ga_2O_3$, diamond, carbon, and graphite.

5. The structure of claim 4, wherein the sintered body includes at least one or more types of sintered bodies selected from a group including group IV element semiconductors, group III-V compound semiconductors, and group II-VI compound semiconductors.

6. The structure of claim 4, wherein the sintered body includes at least one or more types of sintered bodies selected from a group including silicon carbide, gallium nitride, silicon, aluminum nitride, and gallium oxide.

7. The structure of claim 1, wherein the substrate includes a sintered body.

8. The structure of claim 7, wherein the sintered body includes at least one or more types of sintered bodies selected from a group including group IV element semiconductors, group III-V compound semiconductors, and group II-VI compound semiconductors.

9. The structure of claim 7, wherein the sintered body includes at least one or more types of sintered bodies selected from a group including silicon carbide, gallium nitride, silicon, aluminum nitride, and gallium oxide.

10. The structure of claim 7, wherein the bonding interface layer further includes at least one or more types of amorphous material selected from a group including group IV element semiconductors, group III-V compound semiconductors, and group II-VI compound semiconductors.

11. A power semiconductor device, comprising:
the semiconductor substrate structure of claim 1; and
at least one or more selected from a group including SiC Schottky barrier diodes, SiC-MOSFETs, SiC bipolar transistors, SiC diodes, SiC thyristors, and SiC insulated gate bipolar transistors.

* * * * *